(12) United States Patent
Posseme et al.

(10) Patent No.: US 11,217,446 B2
(45) Date of Patent: Jan. 4, 2022

(54) METHOD FOR FABRICATING AN INTEGRATED CIRCUIT INCLUDING A NMOS TRANSISTOR AND A PMOS TRANSISTOR

(71) Applicant: Commissariat A L'Energie Atomique et aux Energies Alternatives, Paris (FR)

(72) Inventors: Nicolas Posseme, Grenoble (FR); Loic Gaben, Grenoble (FR); Cyrille Le Royer, Grenoble (FR); Fabrice Nemouchi, Grenoble (FR); Shay Reboh, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 106 days.

(21) Appl. No.: 16/716,687

(22) Filed: Dec. 17, 2019

(65) Prior Publication Data
US 2020/0203161 A1 Jun. 25, 2020

(30) Foreign Application Priority Data
Dec. 18, 2018 (FR) .................................. 18 73216

(51) Int. Cl.
*H01L 21/02* (2006.01)
*H01L 21/8238* (2006.01)
*H01L 21/84* (2006.01)

(52) U.S. Cl.
CPC .. *H01L 21/02381* (2013.01); *H01L 21/02488* (2013.01); *H01L 21/02532* (2013.01);
(Continued)

(58) Field of Classification Search
CPC ........... H01L 27/1203; H01L 21/02381; H01L 21/02532; H01L 21/02694;
(Continued)

(56) References Cited

U.S. PATENT DOCUMENTS

2008/0220594 A1 9/2008 Clavelier et al.
2012/0068267 A1 3/2012 Bedell et al.
(Continued)

FOREIGN PATENT DOCUMENTS

EP 1 968 103 A1 9/2008
EP 2 782 118 A1 9/2014

OTHER PUBLICATIONS

French Preliminary Search Report dated Dec. 18, 2018 in Patent Application No. FR 1873216 (with English translation of categories of cited documents), 9 pages.
(Continued)

*Primary Examiner* — Moazzam Hossain
*Assistant Examiner* — Stanetta D Isaac
(74) *Attorney, Agent, or Firm* — Oblon, McClelland, Maier & Neustadt, L.L.P.

(57) ABSTRACT

A process for fabricating an integrated circuit is provided, including steps of providing a substrate including a silicon layer, a layer of insulator a layer of hard mask and accesses to first and second regions of the silicon layer; forming first and second deposits of SiGe alloy on the first and the second regions in order to form first and second stacks; then protecting the first deposit and maintaining an access to the second deposit; then performing an etch in order to form trenches between the hard mask and two opposite edges of the second stack; then forming a tensilely strained silicon layer in the second region via amorphization of the second region; then crystallization; and enriching the first region in germanium by diffusion from the first deposit.

16 Claims, 28 Drawing Sheets

(52) U.S. Cl.
CPC .................. *H01L 21/02694* (2013.01); *H01L 21/823807* (2013.01); *H01L 21/84* (2013.01)

(58) Field of Classification Search
CPC ......................... H01L 21/8238–823892; H01L 27/10844–10894; H01L 27/092–0928; B81C 2203/0728; B81C 2203/0735; B81C 2203/0742
See application file for complete search history.

(56) References Cited

U.S. PATENT DOCUMENTS

| | | |
|---|---|---|
| 2012/0216158 A1 | 8/2012 | Bedell et al. |
| 2014/0284769 A1 | 9/2014 | Halimaoui et al. |
| 2015/0099335 A1 | 4/2015 | Liu et al. |
| 2017/0309483 A1 | 10/2017 | Reboh et al. |

OTHER PUBLICATIONS

Benjamin Vincent, "Development of « Germanium On Insulators Substrates and Structures by the Germanium Condensation Technique—Procedes De Realisation De Materiaux « Germanium Sur Isolant » Par Technique De Condensation Du Germanium" Institut Polytechnique de Grenoble, Sep. 22, 2008, 180 pages.

Tsutomu Tezuka, et al., "A Novel Fabrication Technique of Ultrathin and Relaxed SiGe Buffer Layers with High Ge Fraction for Sub-100nm Strained Silicon-on-Insulator MOSFETs" Jpn. J. Appl. Phys., vol. 40, 2001, pp. 2866-2874.

"Evaluating the Introduction of Tensile Strain to the Channel in nMOSFETs" These Aurore Bonnevialle, 2016, 59 pages.

[Fig. 1]
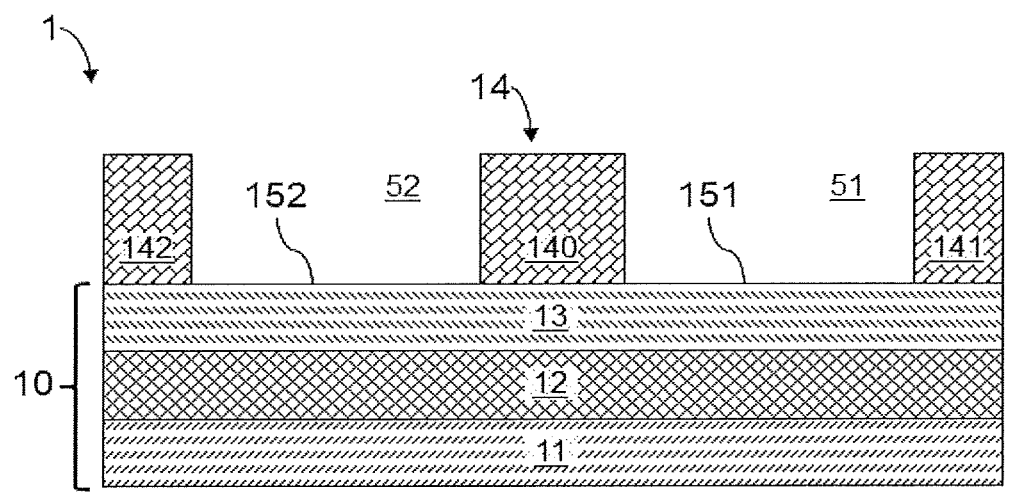

[Fig. 2]
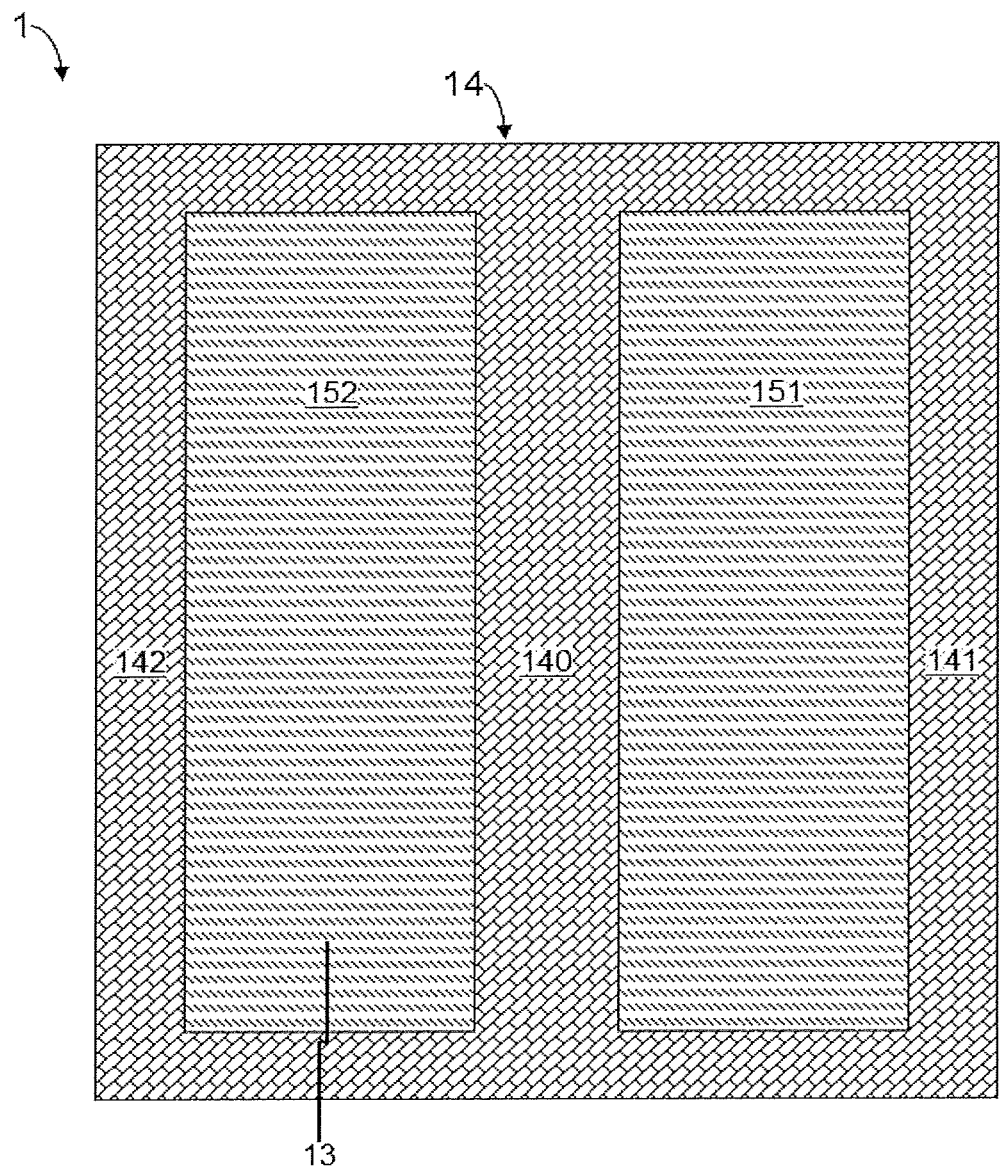

[Fig. 3]
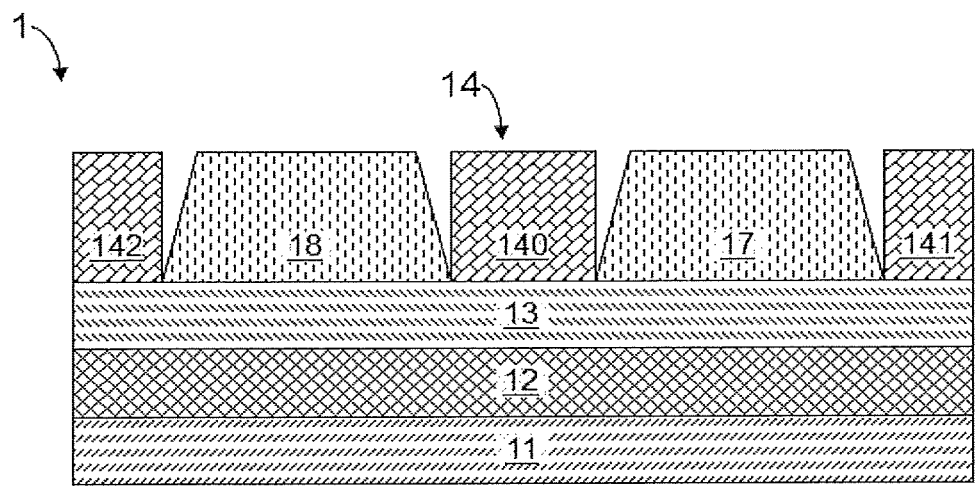
[Fig. 4]
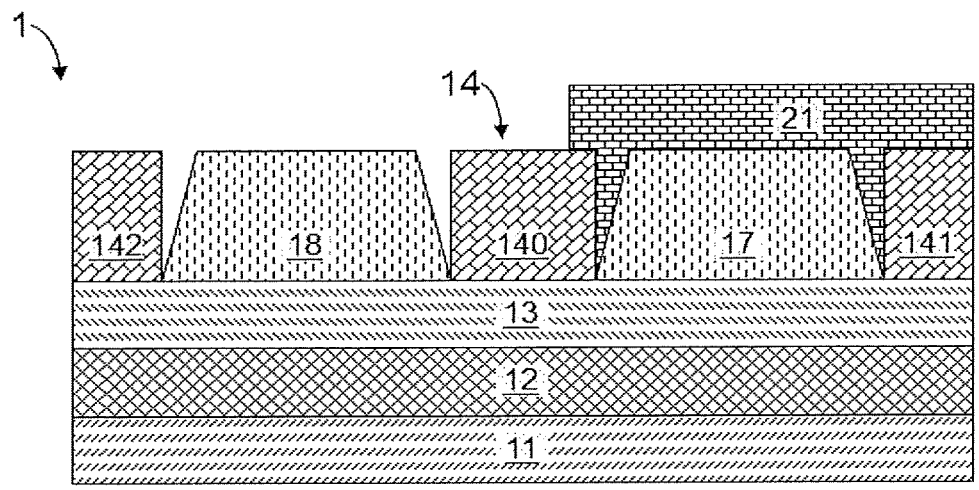

[Fig. 5]
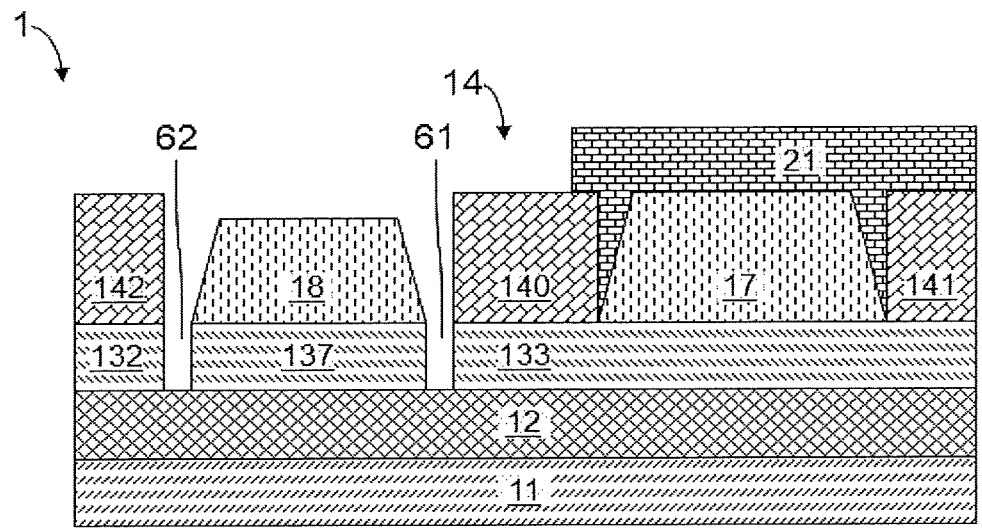
[Fig. 6]
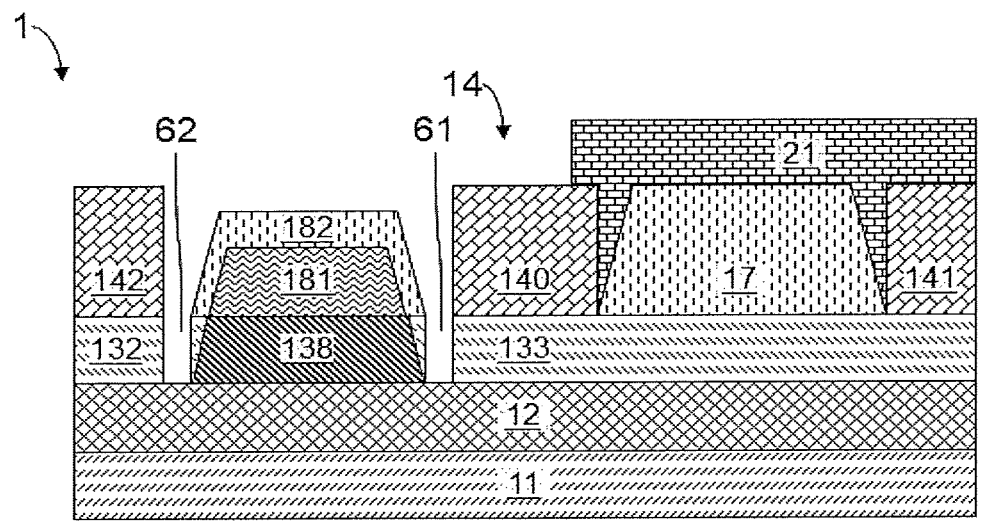

[Fig. 7]
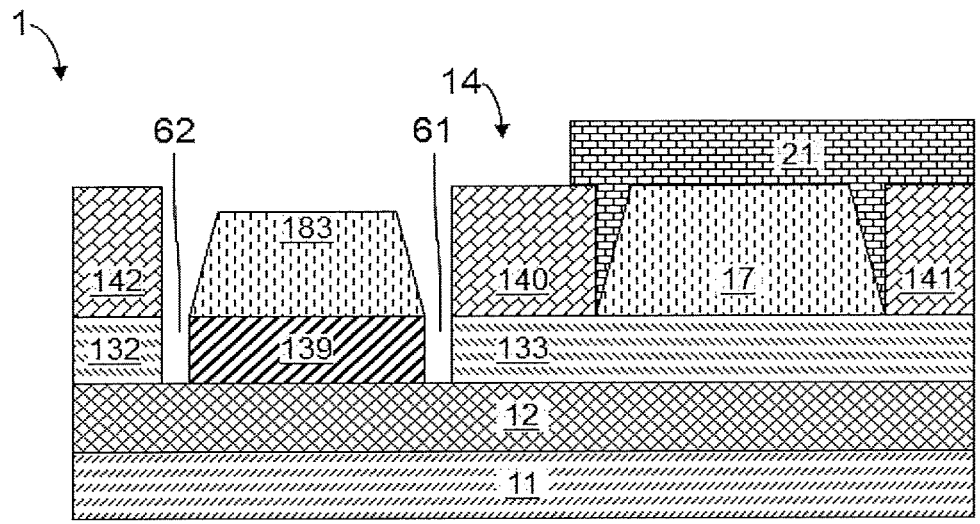
[Fig. 8]
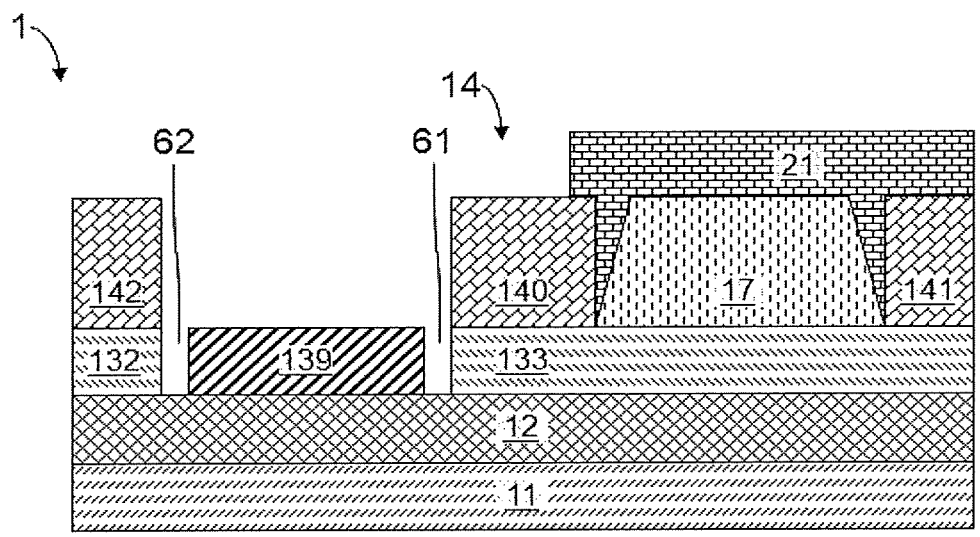

[Fig. 9]
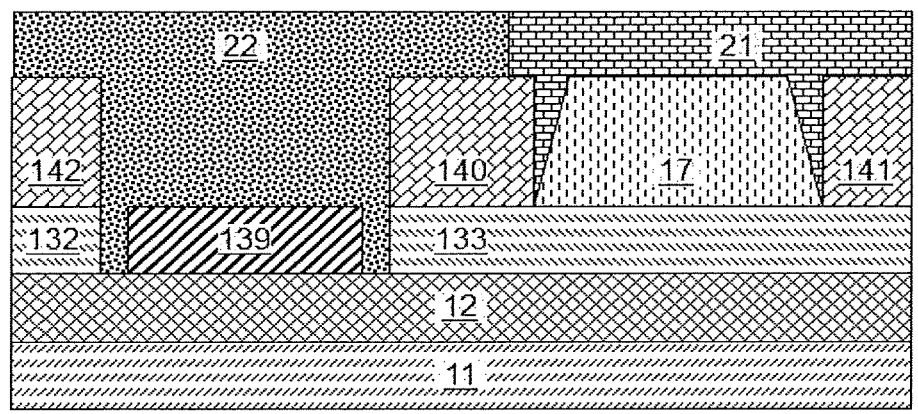
[Fig. 10]
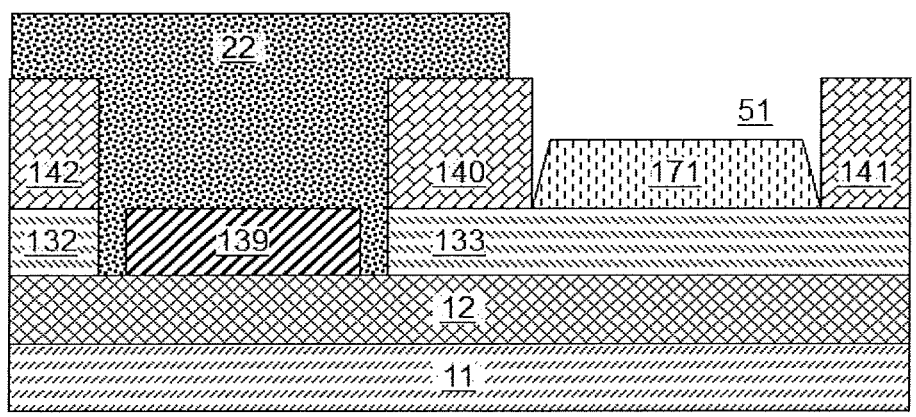

[Fig. 11]
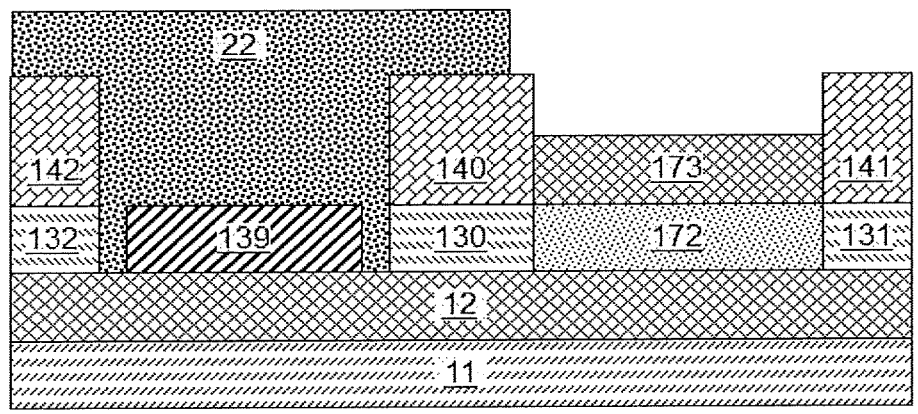
[Fig. 12]
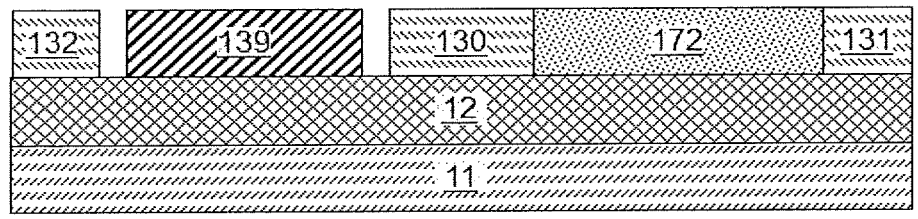

[Fig. 13]
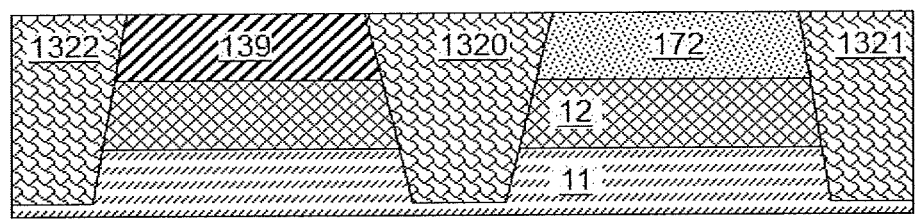
[Fig. 14]
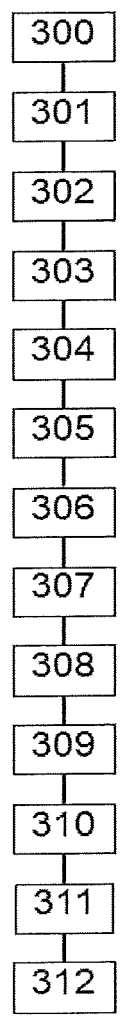

[Fig. 15]
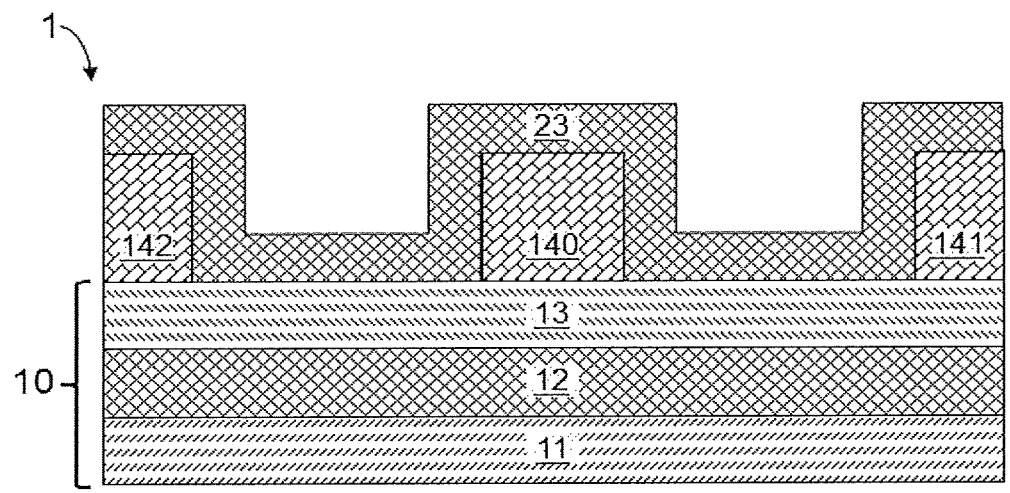
[Fig. 16]
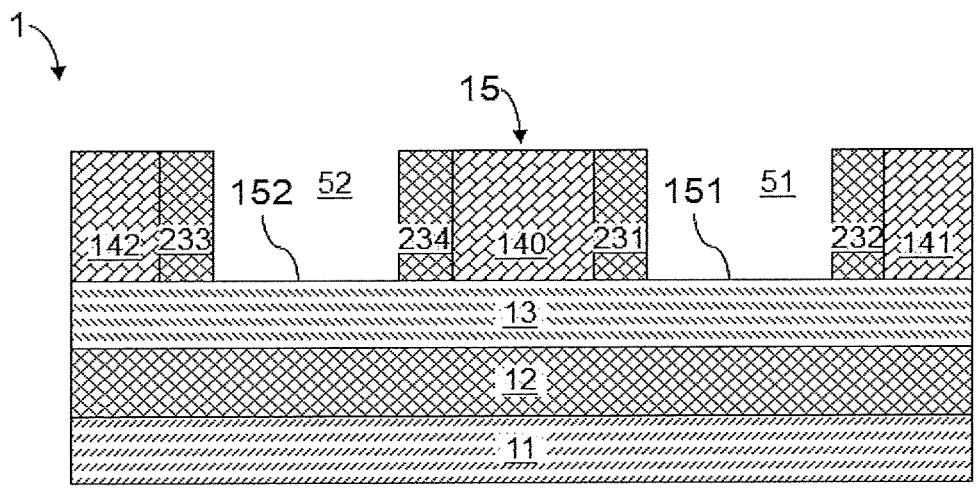

[Fig. 17]
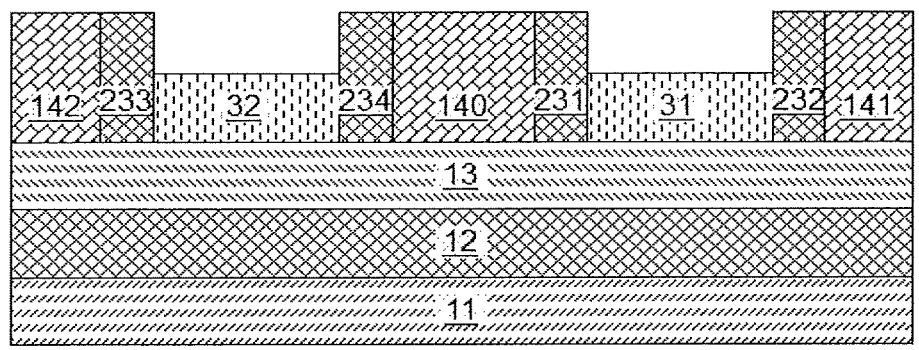
[Fig. 18]
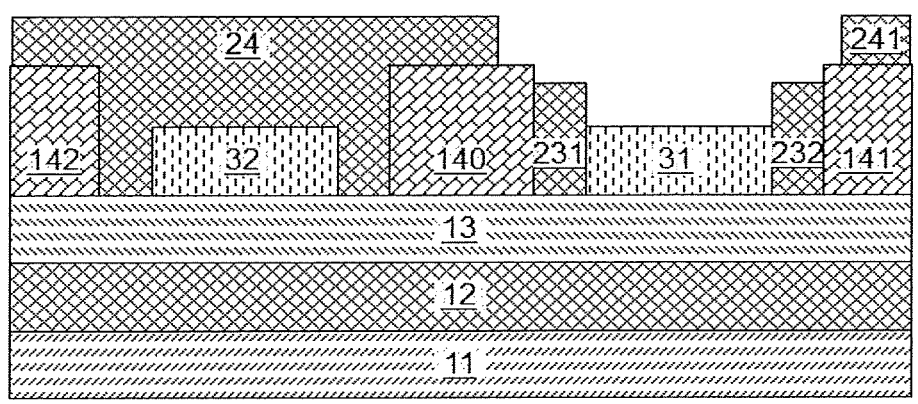

[Fig. 19]
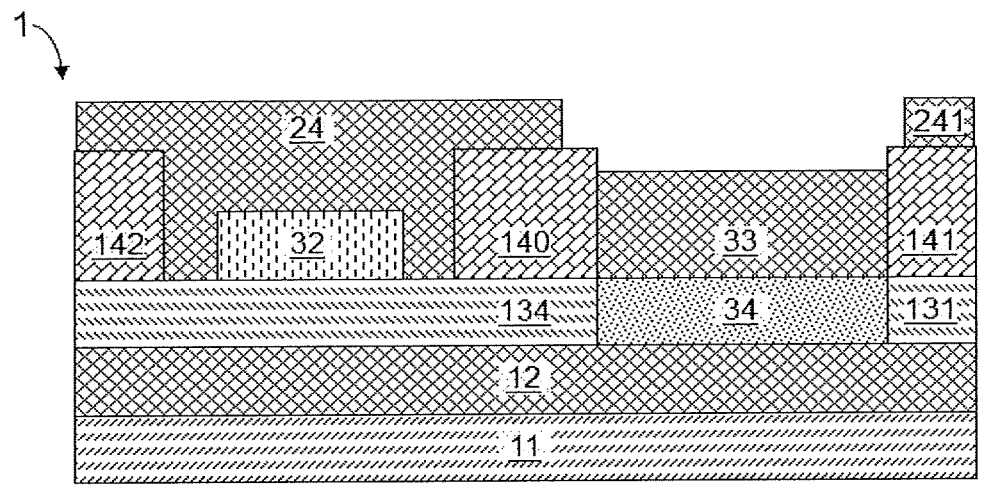
[Fig. 20]
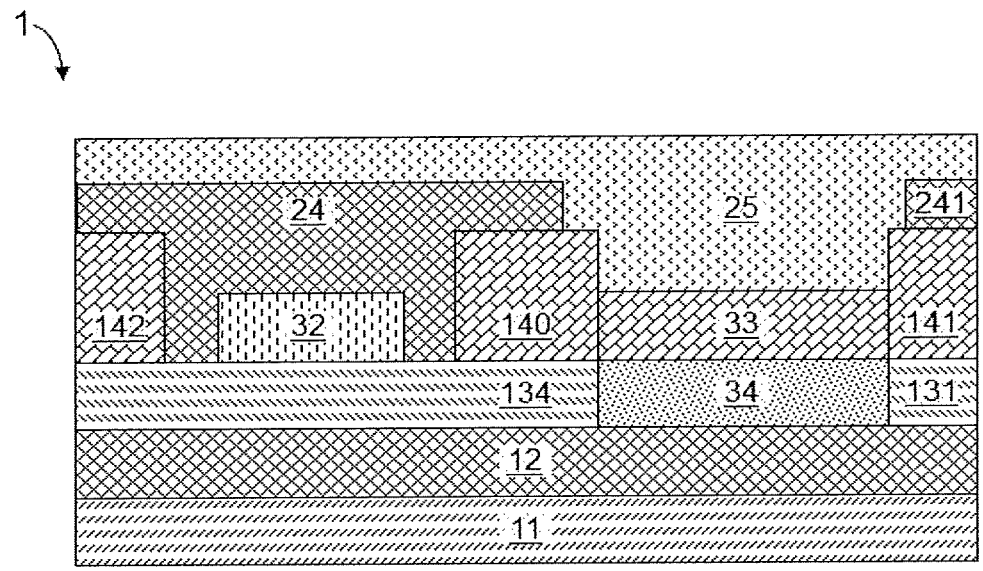

[Fig. 21]
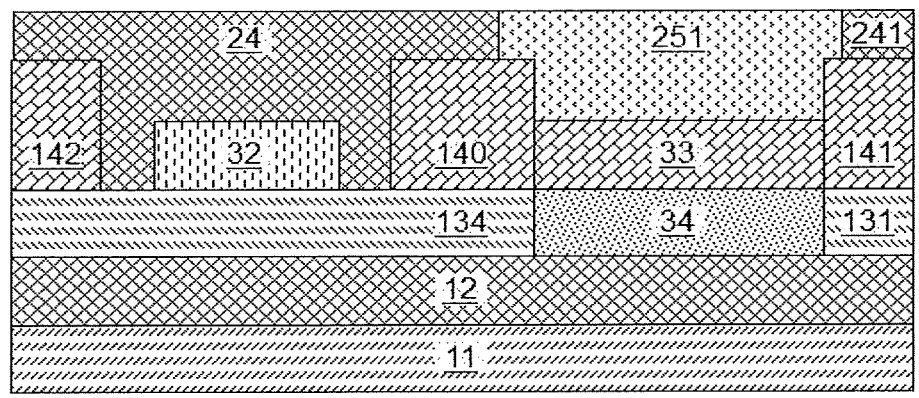
[Fig. 22]
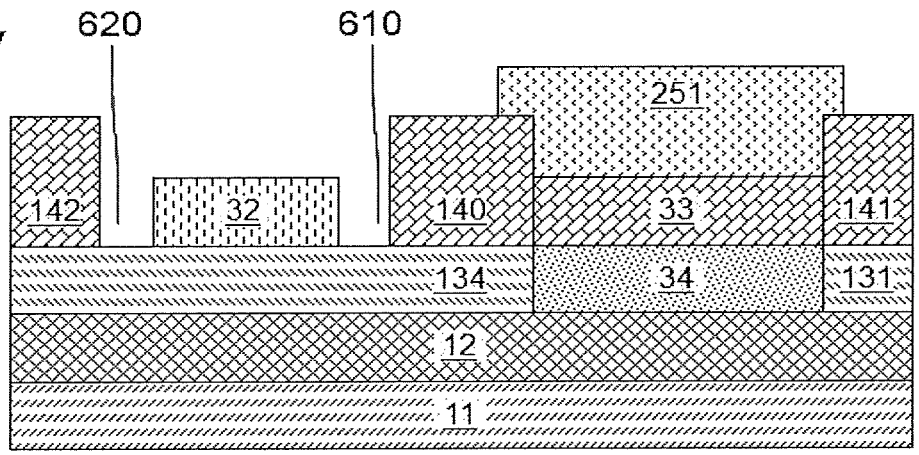

[Fig. 23]
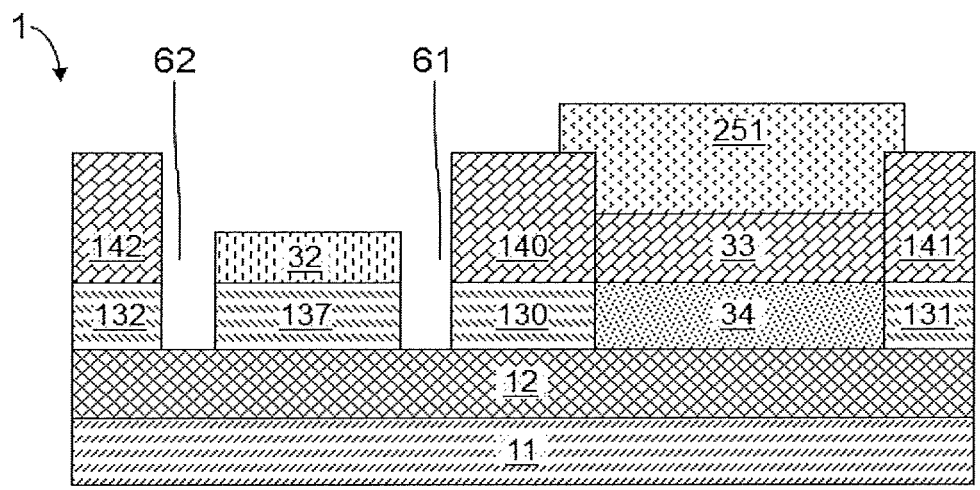
[Fig. 24]
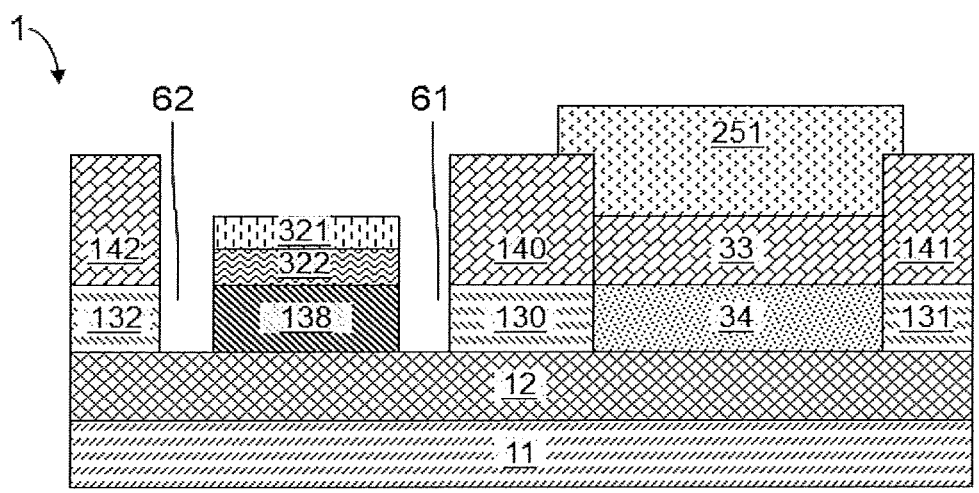

[Fig. 25]
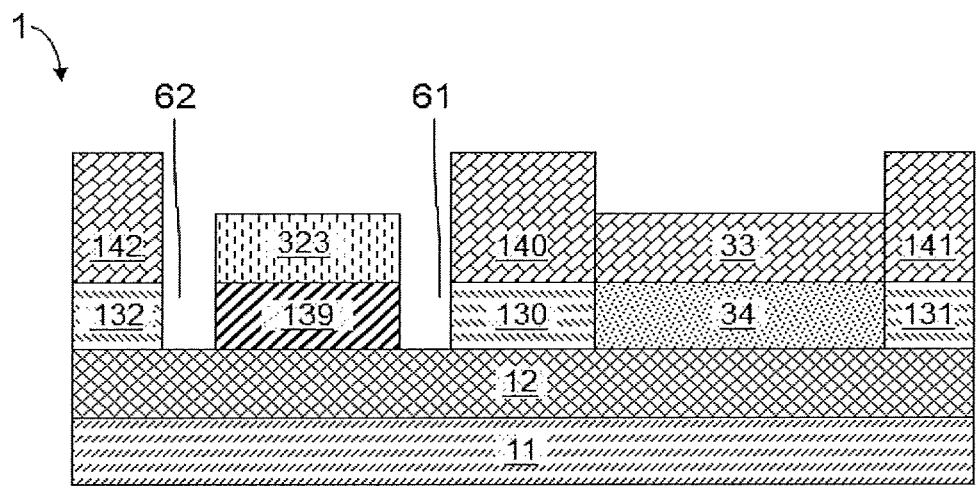
[Fig. 26]
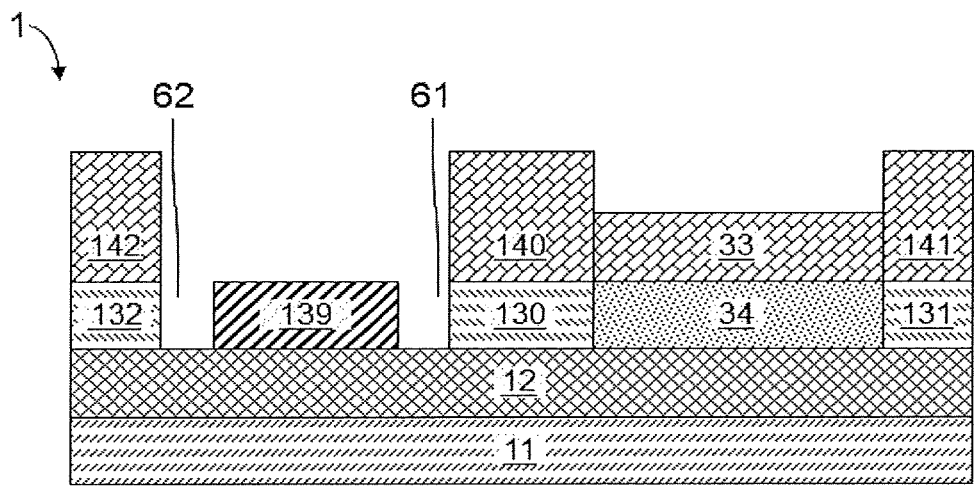

[Fig. 27]
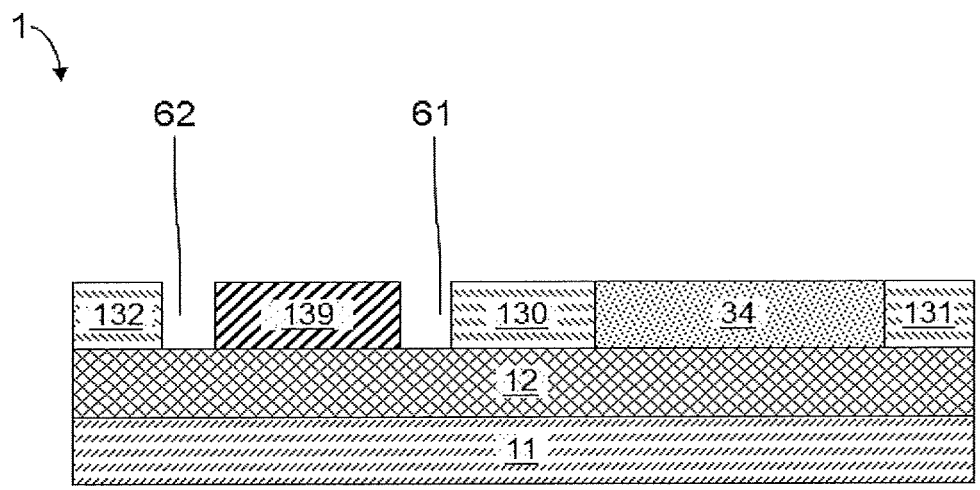
[Fig. 28]
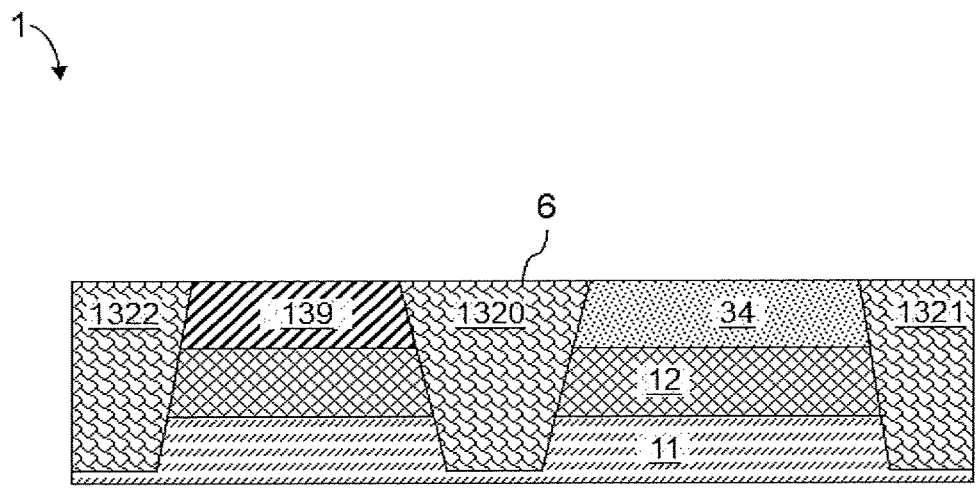

[Fig. 29]
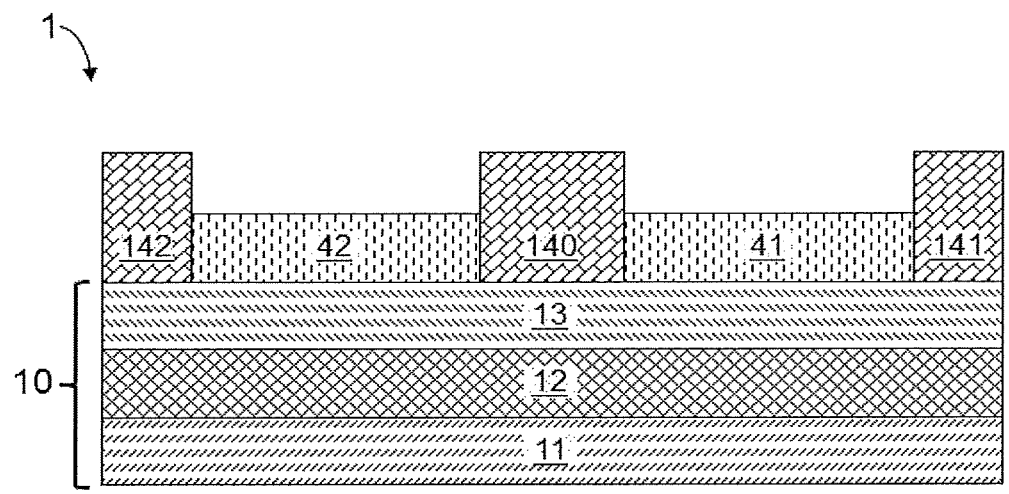
[Fig. 30]
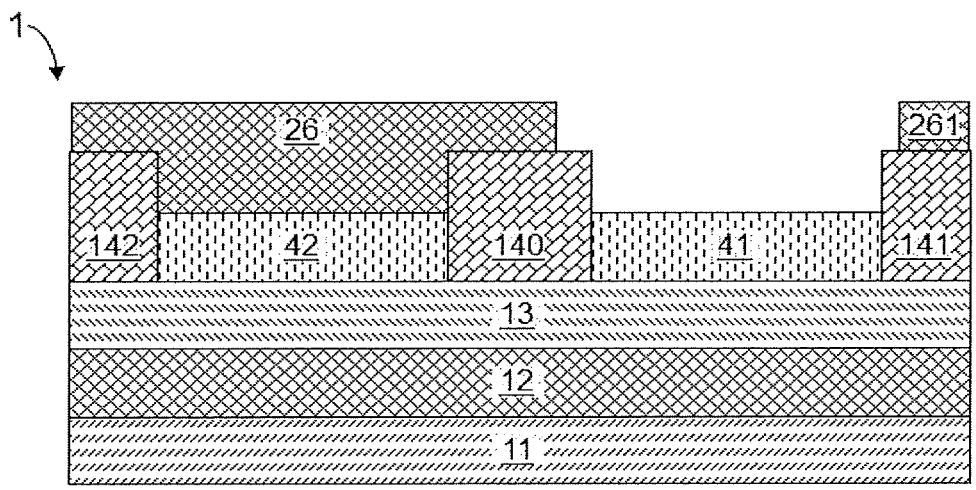

[Fig. 31]
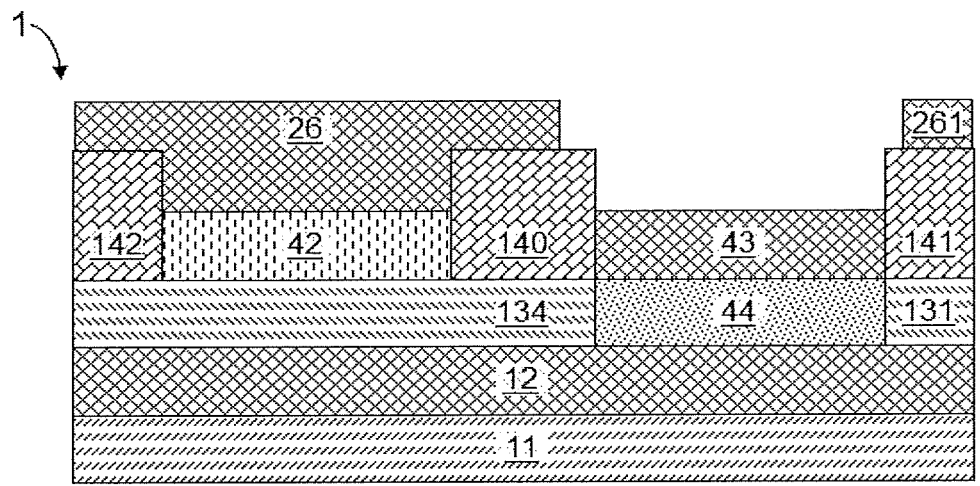
[Fig. 32]
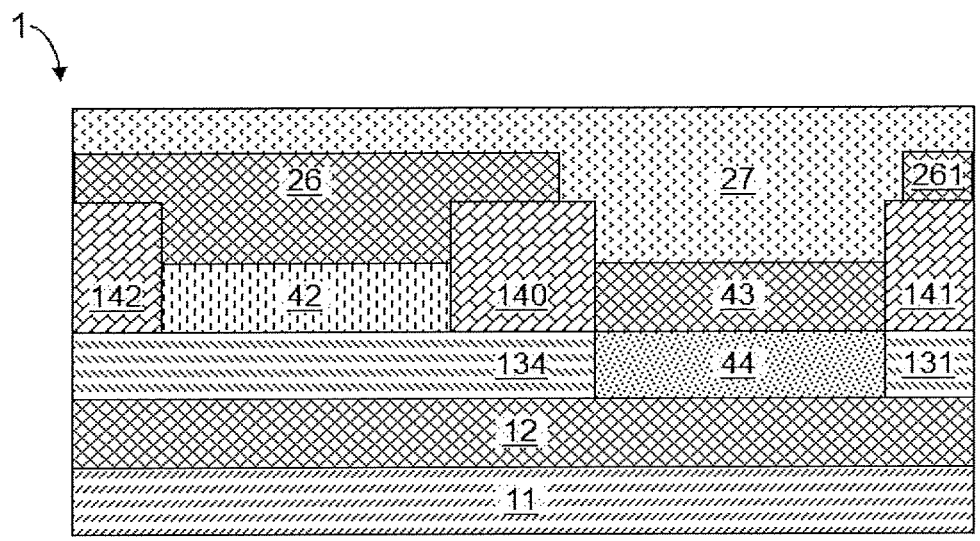

[Fig. 33]
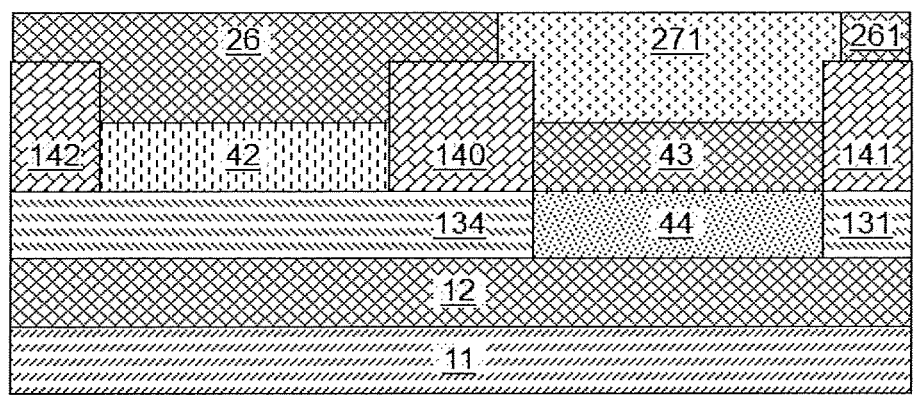
[Fig. 34]
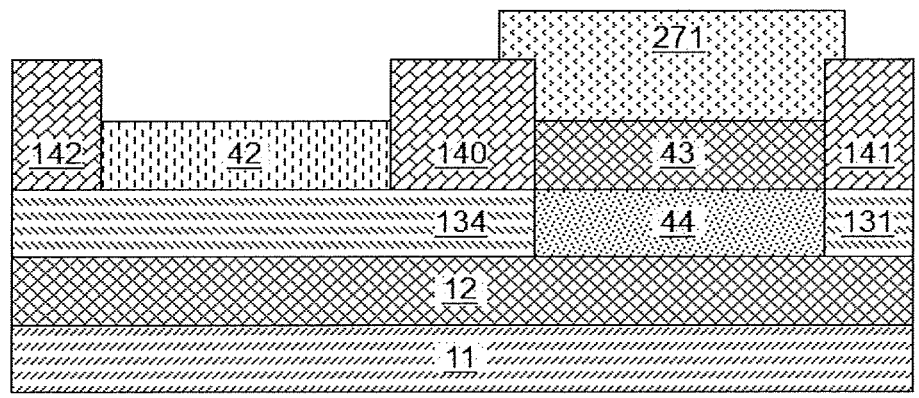

[Fig. 35]
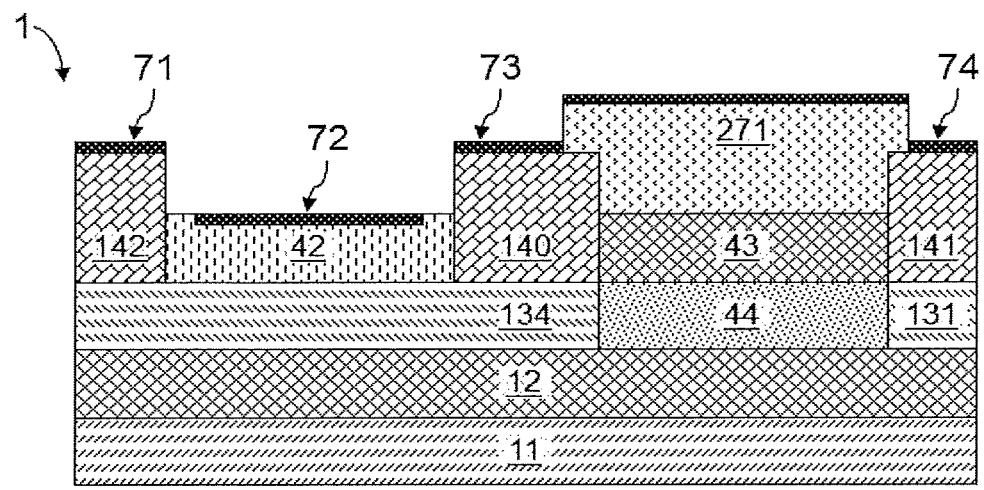
[Fig. 36]
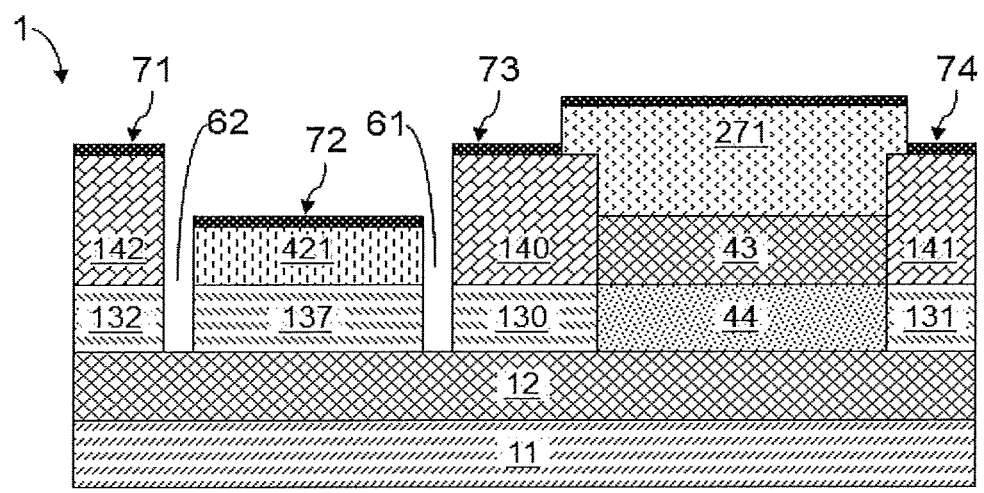

[Fig. 37]
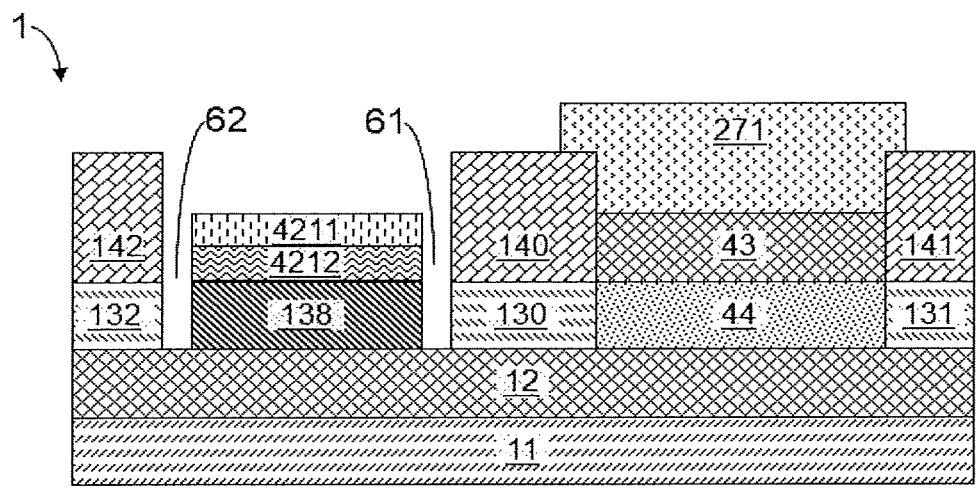
[Fig. 38]
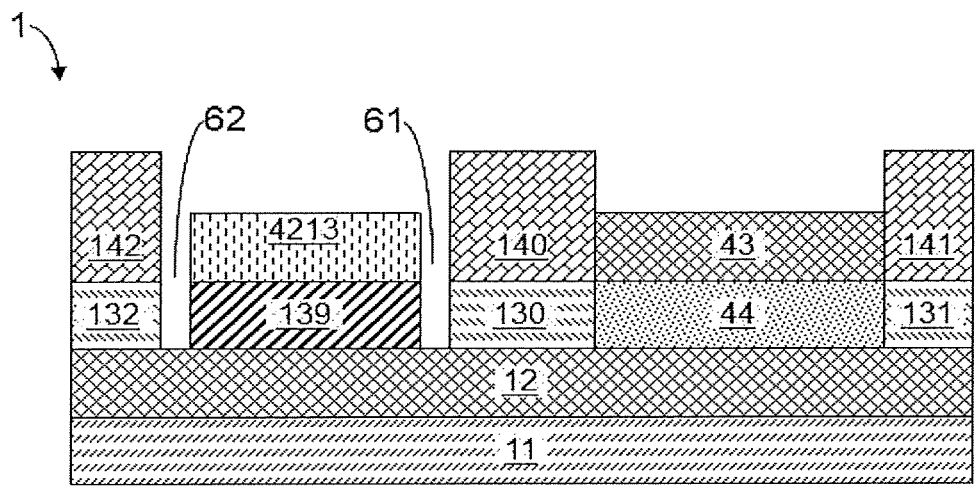

[Fig. 39]
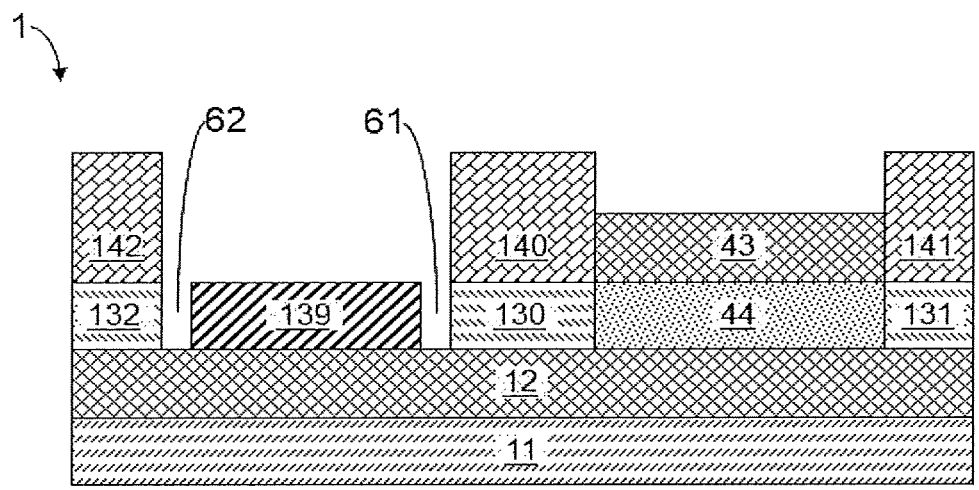
[Fig. 40]
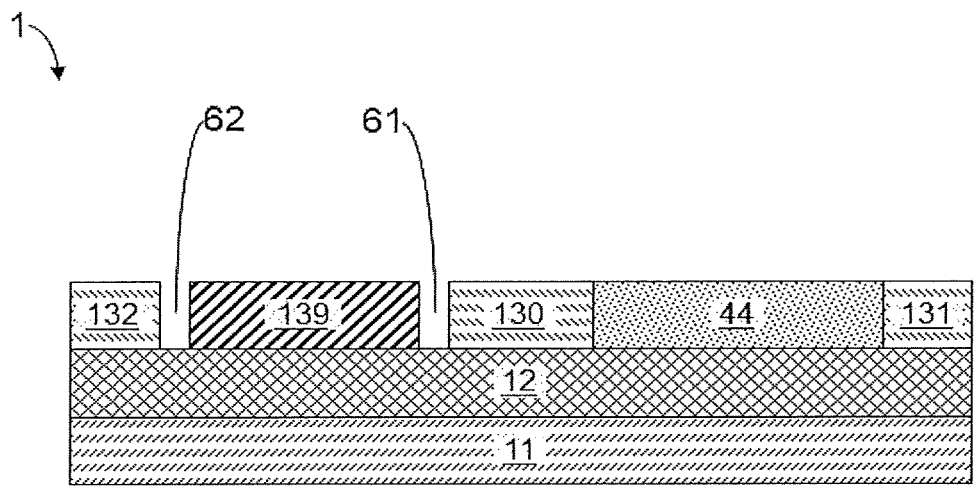

[Fig. 41]
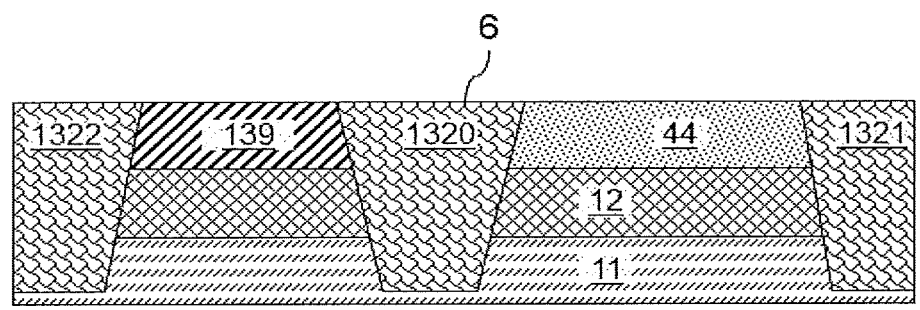
[Fig. 42]
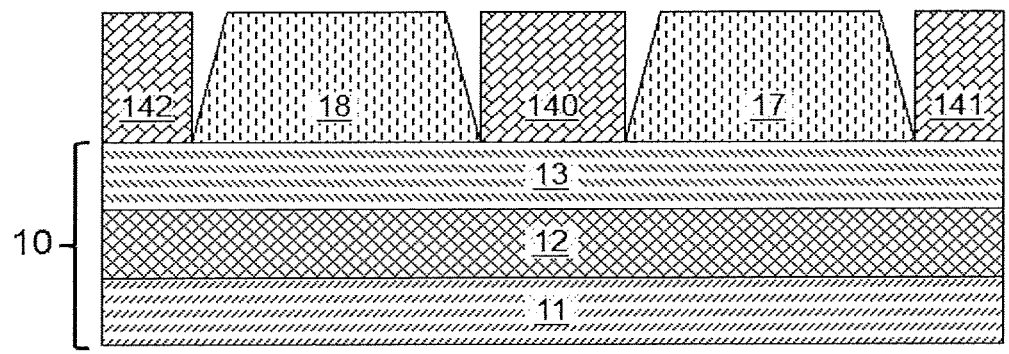

[Fig. 43]
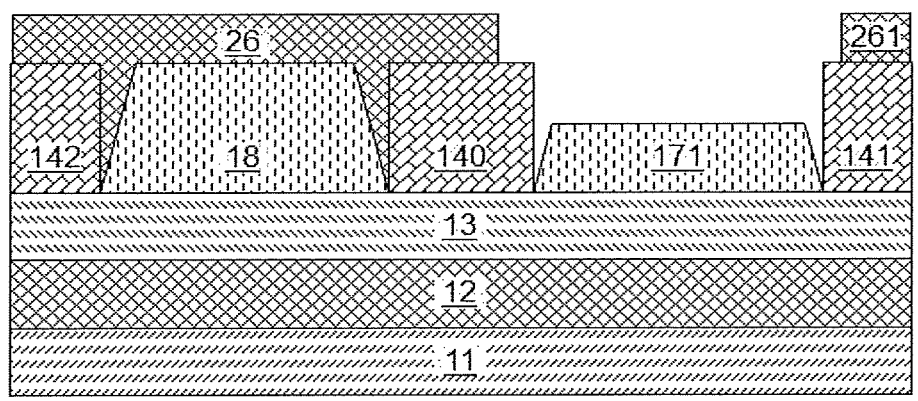
[Fig. 44]
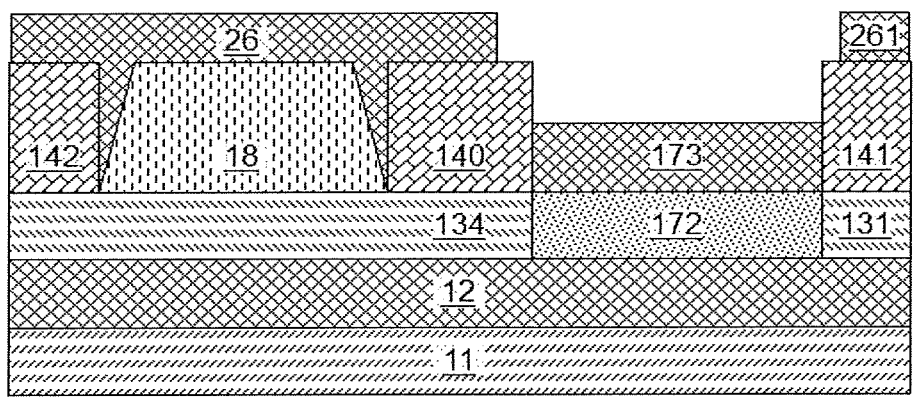

[Fig. 45]
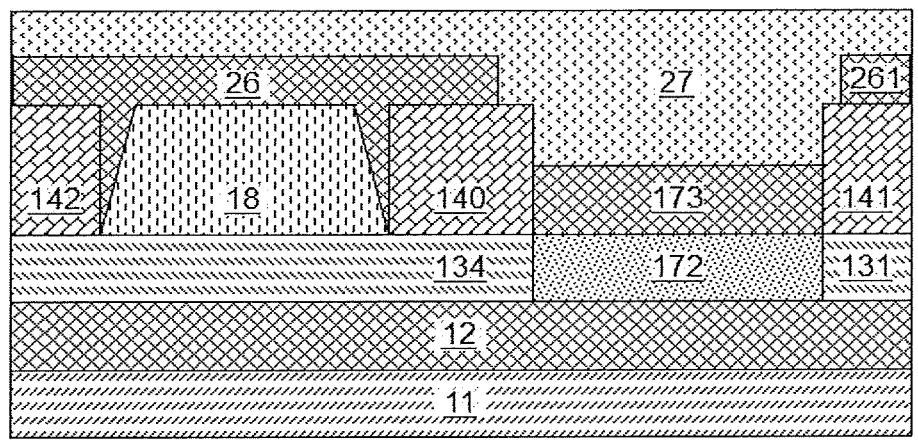
[Fig. 46]
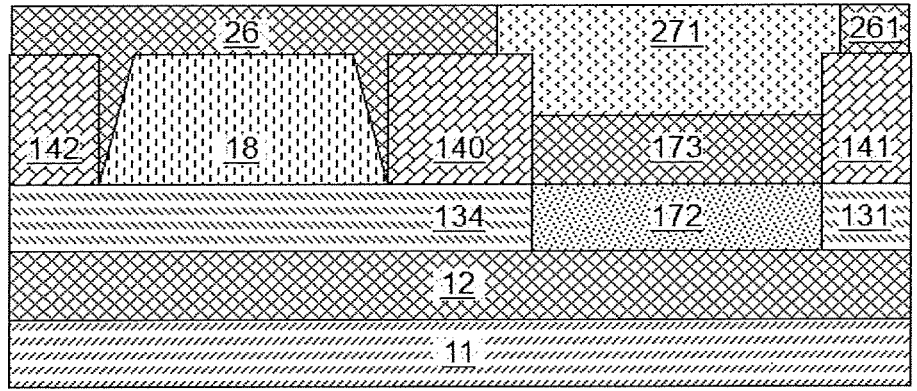

[Fig. 47]
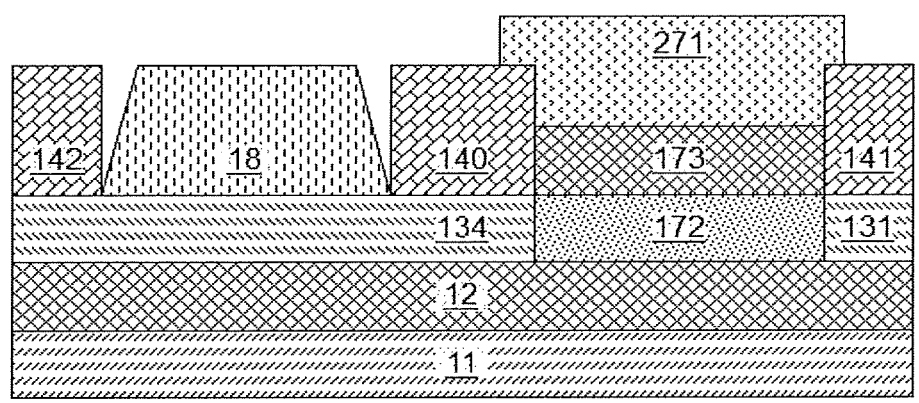
[Fig. 48]
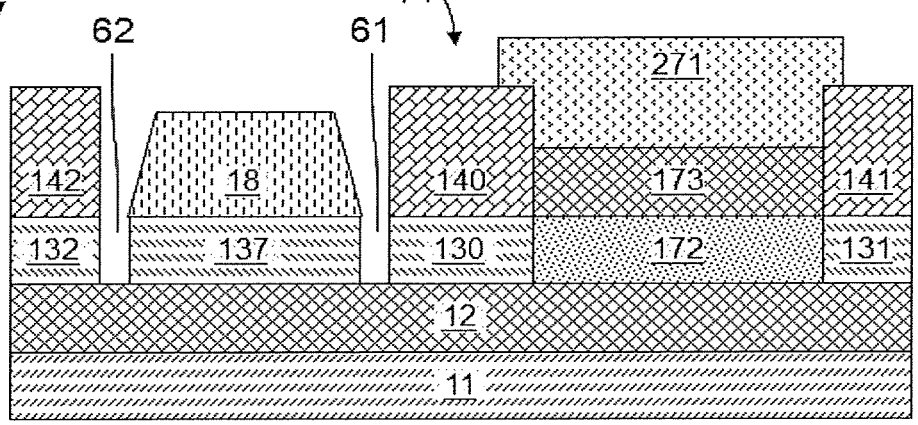

[Fig. 49]
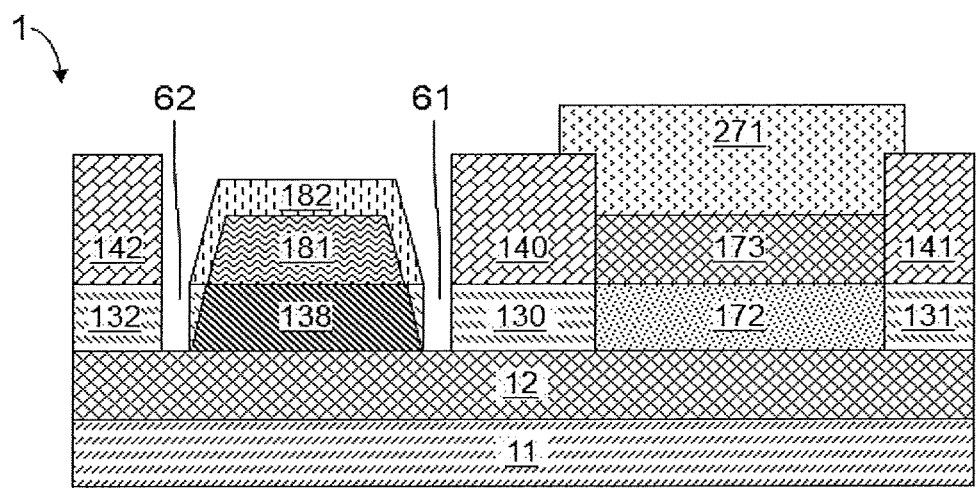
[Fig. 50]
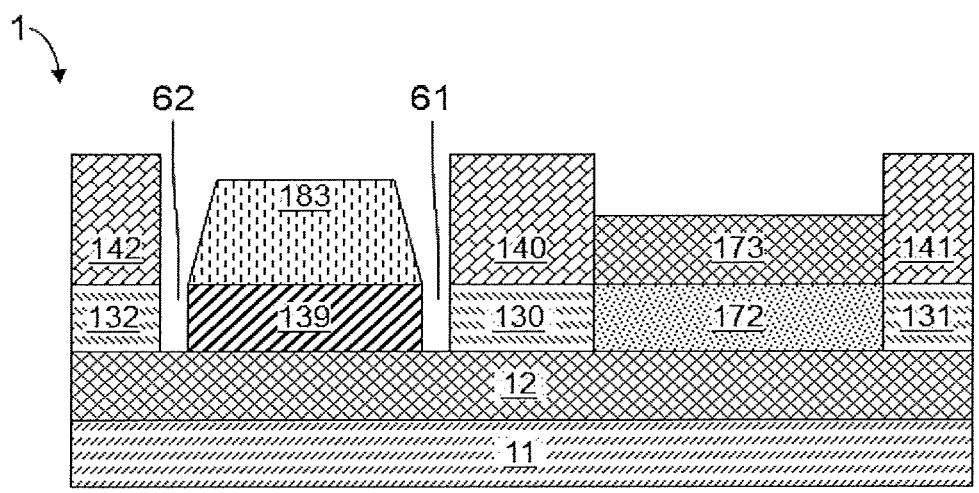

[Fig. 51]
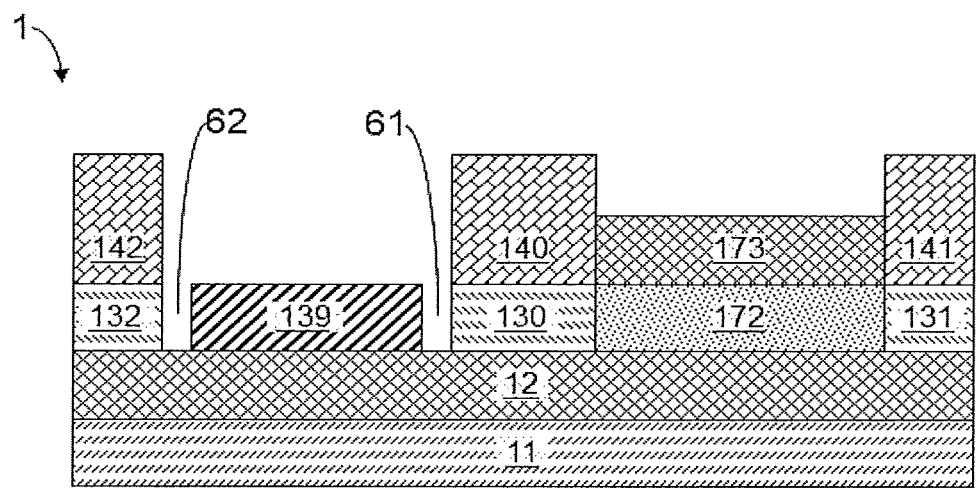
[Fig. 52]
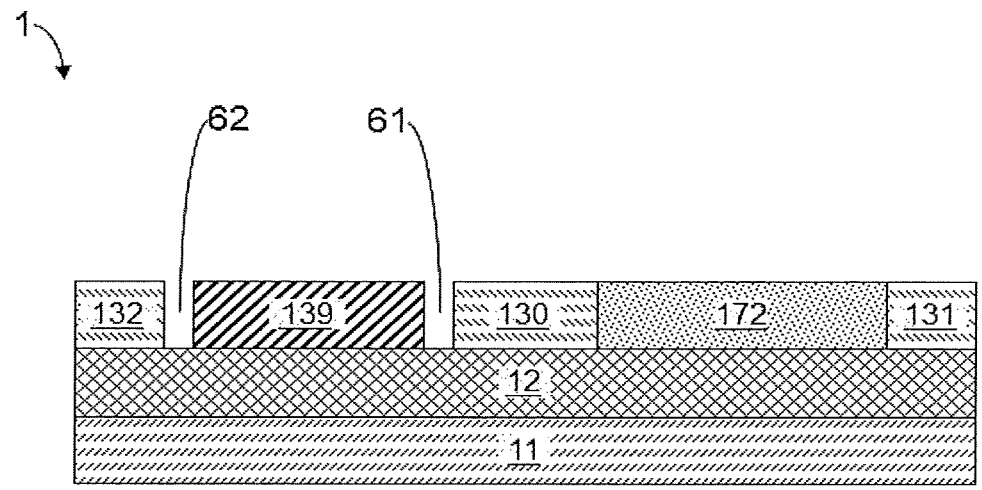

[Fig. 53]
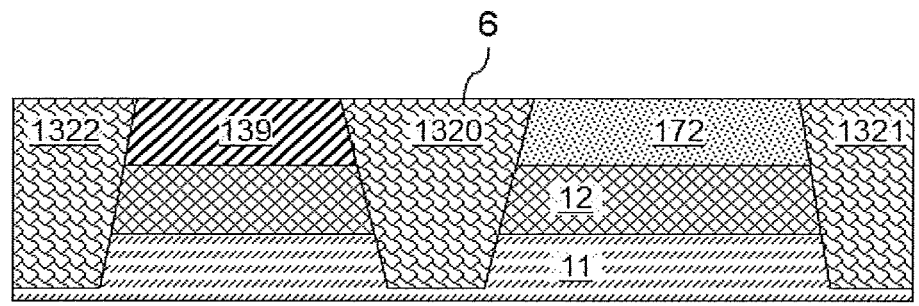

METHOD FOR FABRICATING AN INTEGRATED CIRCUIT INCLUDING A NMOS TRANSISTOR AND A PMOS TRANSISTOR

The invention relates to the fabrication of silicon-on-insulator transistors, and in particular to the fabrication of silicon-on-insulator transistors having improved carrier-mobility properties in the channels thereof.

In order to increase mobility in the channel of pMOS transistors and to limit the offset in threshold voltage with respect to a cointegrated nMOS transistor, it is known to deposit an SiGe layer by epitaxy on a silicon layer, then to carry out a thermal oxidation and an anneal, so as to achieve a condensation that concentrates the germanium in the silicon layer.

Moreover, with a view to improving the mobility in the channel of nMOS transistors, it is known to carry out a process referred to as the STRASS process. This process includes depositing SiGe on a silicon layer, relaxing the SiGe and amorphizing the lower portion thereof and the silicon layer. Next, the SiGe layer is recrystallized from its top and the silicon layer is recrystallized in order to tensilely strain it. After removal of the SiGe layer, the silicon layer remains tensilely strained.

Implementation of these fabricating processes theoretically allows a combination of nMOS transistors and pMOS transistors with suitable properties to be obtained. In contrast, the implementation of such fabricating processes requires a very high number of industrial processing steps and a high number of photolithography steps to be implemented. Such a fabricating process thus currently has a cost that is too high to allow such a combination of transistors.

The invention aims to solve one or more of these drawbacks. The invention thus relates to a process for fabricating an integrated circuit, such as defined in the appended claims.

The invention also relates to the variants of the dependent claims. Those skilled in the art will understand that any of the features of the description or of the dependent claims may be combined independently with the features of an independent claim, without however constituting an intermediate generalization.

Other features and advantages of the invention will become more clearly apparent from the nonlimiting description that is given thereof below, by way of indication, with reference to the appended drawings, in which:

FIG. 1 and
FIG. 2 are respectively views in cross section and from above of an FDSOI (fully-depleted silicon-on-insulator) substrate intended to form an nMOS transistor and a pMOS transistor;
FIG. 3,
FIG. 4,
FIG. 5,
FIG. 6,
FIG. 7,
FIG. 8,
FIG. 9,
FIG. 10,
FIG. 11,
FIG. 12, and
FIG. 13 are views in cross section of said nMOS and pMOS transistors at various stages of their fabricating process according to a first embodiment;
FIG. 14 is a diagram illustrating the steps of the fabricating process according to the first embodiment;
FIG. 15,
FIG. 16,
FIG. 17,
FIG. 18,
FIG. 19,
FIG. 20,
FIG. 21,
FIG. 22,
FIG. 23,
FIG. 24,
FIG. 25,
FIG. 26,
FIG. 27 and
FIG. 28 are views in cross section of said nMOS and pMOS transistors at various stages of their fabricating process according to a second embodiment;
FIG. 29,
FIG. 30,
FIG. 31,
FIG. 32,
FIG. 33,
FIG. 34,
FIG. 35,
FIG. 36,
FIG. 37,
FIG. 38,
FIG. 39,
FIG. 40 and
FIG. 41 are views in cross section of said nMOS and pMOS transistors at various stages of their fabricating process according to a third embodiment;
FIG. 42,
FIG. 43,
FIG. 44,
FIG. 45,
FIG. 46,
FIG. 47,
FIG. 48,
FIG. 49,
FIG. 50,
FIG. 51,
FIG. 52, and
FIG. 53 are views in cross section of said nMOS and pMOS transistors at various stages of their fabricating process according to a fourth embodiment.

FIG. 1 is a view in cross section of an example of a structure 1 including an FDSOI substrate 10 configured to form nMOS and pMOS transistors using a process according to the invention. FIG. 2 is a view from above of the same substrate 10.

To obtain this configuration, a substrate 10 equipped with a silicon layer 13, for example made of unintentionally doped silicon, is provided. The silicon layer 13 has a thickness typically comprised between 5 and 20 nm, and for example of 6 nm. The silicon layer 13 is here formed on a layer of buried insulator 12, which is for example made of SiO$_2$, of a thickness typically comprised between 15 and 40 nm, and for example of 25 nm. The buried layer of insulator 12 is formed on a substrate 11, which is typically made of unintentionally doped silicon.

Beforehand, the following steps were carried out: a step of masking (not shown) the entirety of the surface of the silicon layer 13, then a step of lithography (not shown) in order to form a hard mask 14 on the silicon layer 13, and lastly an etching step (not shown) in order to transfer the pattern of the mask 14 formed beforehand. This made it possible to open apertures 51 and 52 and uncover the associated regions 151 and 152 of the silicon layer 13 at the bottom of the apertures 51 and 52. A strip of hard mask 140 is interposed between the regions 151 and 152. The region 151 is interposed between a strip 141 of hard mask and the strip 140. The region 152 is interposed between a strip 142 of hard mask and the strip 140. The apertures 51 and 52 for example have a width of at least 60 nm. The regions 151 and 152 thus made accessible form regions for forming an nMOS transistor and a pMOS transistor, respectively.

The invention may be implemented from step 300, starting with the configuration illustrated in FIGS. 1 and 2.

In step 301, a first deposit 17 of SiGe alloy is formed in the aperture 51 on the region 151 as illustrated in FIG. 3. A second deposit 18 of SiGe alloy is simultaneously formed in the aperture 52 on the region 152. The deposits 17 and 18 are typically formed by epitaxial growth with lateral facets. The lateral faces of the deposits 17 and 18 are thus inclined. Processes for growing SiGe epitaxially with facets are known per se to those skilled in the art. The deposits 17 and 18 typically have a thickness comprised between 5 nm and 30 nm. The deposits 17 and 18 for example have a germanium concentration (in number of atoms) comprised between and 35%. The epitaxially grown deposit is for example SiGe containing 30% germanium, grown at a temperature of 630° C. for example using $H_2$ as vector gas and germane ($GeH_4$) and dichlorosilane (DCS, $SiH_2Cl_2$) as precursors (or silane $SiH_4$).

In step 302, the first deposit 17 is covered with a layer 21 of hard mask on the element 17, forming a protective layer, as illustrated in FIG. 4. The layer 21 is typically made of $SiO_2$. This layer 21 for example has a thickness comprised between nm and 40 nm.

In step 303, a step of etching the second deposit 18 and the layer 13 advantageously anisotropically is carried out. The etch is stopped on the layer 12, in order to obtain the configuration illustrated in FIG. 5. This etching allows trenches 61 and 62, which divide the layer 13 into an element 137 and regions 132 and 133, to be formed. In this example, a single trench encircles the element 137. The layer 12 then forms the bottom of the trenches 61 and 62. The superposition of the second deposit 18 and of the Si element 137 forms a stack. The trenches 61 and 62, on either side of this stack, typically have a width comprised between 1 and 10 nm. In the present example, the trenches 61 and 62 are easily etched because of the facets formed during the formation of the second deposit 18. The second deposit 18 thus has a thickness that decreases as the distance to the hard mask 14 decreases. The thickness of the deposit 18 may for example be substantially zero at its interface with the hard mask 14. Etching in proximity to the hard mask 14 thus allows the layer 12 to be easily reached around the second deposit 18.

In step 304, an ion implantation is carried out that amorphizes the stack depthwise. From the second deposit 18, the amorphization forms a layer 181 made of amorphous SiGe. From the element 137, the amorphization forms an element 138 made of amorphous silicon. On the surface of the second deposit 18, a layer 182 formed from a crystalline seed of non-amorphized SiGe is preserved. The crystalline surface of the element 137 is also preserved on the amorphous element 138. Thus, the configuration illustrated in FIG. 6 is obtained. The presence of the trenches 61 and 62 on either side of the layer 182 allows the layer 182 to not undergo lateral strain and to adopt a relaxed strain state in a plane parallel to the layer 12.

In step 305, an anneal is carried out in order to recrystallize the layer 181 and the element 138. The anneal is for example carried out at a temperature of 600° C. to 700° C., advantageously maintained for 30 s to 5 min (depending on the thickness of the stack of SiGe/Si layers). The annealing operation allows the configuration illustrated in FIG. 7 to be obtained, in which a layer 183 of relaxed SiGe has been reformed above an Si element 139. The Si element 139 then takes the lattice parameter of the relaxed SiGe layer 183 and therefore becomes tensilely strained in a plane parallel to the layer 12.

In step 306, the relaxed SiGe layer 183 is removed by etching, this allowing the configuration illustrated in FIG. 8 to be obtained. The element 139 made of silicon preserves a tensile strain in a plane parallel to the layer 12.

In step 307, a layer 22 of hard mask is formed on the element 139, as illustrated in FIG. 9. The layer 22 forms a protective layer. The element 139 is then protected during subsequent etching steps. The second protective layer 22 is typically made of SiN. This layer 22 for example has a thickness comprised between 30 and 50 nm. The thickness of the layer 22 formed is sufficient to bypass the top of the layer 21.

In step 308, a step of etching the protective layer 21 and the first deposit 17 advantageously anisotropically is carried out. An SiGe element 171 that is accessible via the aperture 51 is thus formed. The configuration illustrated in FIG. 10 is thus obtained.

In step 309, a thermally oxidizing anneal of the SiGe element 171 is carried out. This anneal causes germanium to diffuse from the element 171 into the silicon layer 13, this leading to the formation, in the layer 13, of the following elements:
 an SiGe element 172 formed by enriching in germanium the layer 13;
 residual Si regions 130 and 131. The regions 130 and 131 are placed plumb with the strips 140 and 141 of the layer of hard mask.

The upper surface of the element 172 is covered by a layer 173 of $SiO_2$ obtained via thermal oxidation of the element 171. The obtained configuration is illustrated in FIG. 11. The SiGe element 172 preserves the lattice parameters of the original silicon layer 13 in the plane. The diffusion of the germanium into the silicon layer 13 leads to the creation of a biaxial compressive strain in a plane parallel to the layer of insulator 12 in the element 172 formed. The limit between the element 172 and the regions 130 and 131 is positioned substantially plumb with the lateral faces of the strips 140 and 141, respectively. The superposition of the SiGe element 172 and of the $SiO_2$ layer 173 forms a stack.

In step 310, the $SiO_2$ layer 173, the protective layer 22 and the strips 140, 141 and 142 are removed, as illustrated in FIG. 12. Thus, access is obtained to the SiGe element 172 on the one hand and to the element 139 on the other hand.

In step 311, the elements 130, 131 and 132 are removed in order to form trenches by etching. The trenches are then filled with insulator in order to form the elements 1320, 1321 and 1322. This allows shallow trench isolations to be formed, as illustrated in FIG. 13. Thus, an isolation is formed between a region for forming pMOS transistors and a region for forming nMOS transistors.

Thus, at the end of the process involving the steps of the fabricating process according to this first embodiment, the following are obtained:
 an element 172 made of compressively strained SiGe for forming the channel of pMOS transistors in one region;
 an element 139 made of tensilely strained silicon for forming the channel of nMOS transistors in the other region.

Other regions of the structure may have an un-strained silicon layer for forming other transistors.

The elements 172 and 139 are obtained from an initial deposit of SiGe formed by epitaxy, with a low number of masking and photolithography steps.

FIG. 14 is a diagram illustrating the steps of the fabricating process according to the first embodiment, as detailed above.

FIG. 15 is a view in cross section of an example of a structure 1 at a stage of a fabricating process according to a second embodiment. Initially, an FDSOI substrate 10 configured to form nMOS and pMOS transistors in accordance with FIGS. 1 and 2 described above is provided.

A dielectric layer 23 is conformally deposited uniformly over the upper surface of the structure 1. The layer 23 is for example made of $SiO_2$, this allowing its thickness to be perfectly controlled.

Next, the layer 23 is etched, advantageously using an anisotropic plasma etch of fluorocarbon chemistry, as illustrated in FIG. 16. This allows apertures 51 and 52 to be opened and the associated regions 151 and 152 of the silicon layer 13 at the bottom of the apertures 51 and 52 to be uncovered.

A strip of hard mask 140 is interposed between the regions 151 and 152. A spacer 231, left over by the etch of the layer 23 and attached to the strip 140, is interposed between the strip 140 and the region 151. A spacer 234, left over by the etch of the layer 23 and attached to the strip 140, is interposed between the strip 140 and the region 152.

The region 151 is interposed between a strip 141 of hard mask and the strip 140. A spacer 232, left over by the etch of the layer 23 and attached to the strip 141, is interposed between the strip 141 and the region 151.

The region 152 is interposed between a strip 142 of hard mask and the strip 140. A spacer 233, left over by the etch of the layer 23 and attached to the strip 142, is interposed between the strip 142 and the region 152.

The apertures 51 and 52 for example have a width of at least 40 nm. The regions 151 and 152 thus made accessible form regions for forming an nMOS transistor and a pMOS transistor, respectively.

Next, in the aperture 51 on the region 151 a first deposit 31 of SiGe alloy is formed, as illustrated in FIG. 17. A second deposit 32 of SiGe alloy is simultaneously formed in the aperture 52 on the region 152. The deposits 31 and 32 are typically formed by epitaxial growth. Processes for growing SiGe epitaxially are known per se to those skilled in the art. The deposits 31 and 32 typically have a thickness comprised between 5 nm and 30 nm. The deposits 31 and 32 for example have a germanium concentration (in number of atoms) comprised between 15 and 35%. The epitaxially grown deposit is for example SiGe containing 30% germanium, grown at a temperature of 630° C. for example using $H_2$ as vector gas and germane ($GeH_4$) and dichlorosilane (DCS, $SiH_2Cl_2$) as precursors (or silane $SiH_4$).

As illustrated in FIG. 18, the second deposit 32 is then covered with a layer 24 of hard mask. The layer 24 forms a protective layer. The layer 24 here merges with the spacers 233 and 234, the layers 23 and 24 being made of the same material. The second deposit 32 is thus protected during the subsequent etching steps by this protective layer. Simultaneously, a layer of hard mask 241 is also deposited on the strip 141. The layers 24 and 241 are typically made of $SiO_2$. These layers 24 and 241 for example have a thickness comprised between 10 and 40 nm.

A thermally oxidizing anneal of the first SiGe deposit 31 is then carried out. This anneal causes germanium to diffuse from the first deposit 31 into the silicon layer 13, this leading to the formation, in said layer 13, of the following elements:

an SiGe element 34 formed by enriching in Ge the layer 13;

residual Si regions 131 and 134. The region 131 is placed plumb with the strip 141 of the layer of hard mask. The region 134 for its part lies plumb with the strip 140.

The upper surface of the element 34 is covered by a layer 33 of $SiO_2$ obtained via thermal oxidation of the first deposit 31 and linking with the spacers 231 and 232. The obtained configuration is illustrated in FIG. 19. The SiGe element 34 preserves the lattice parameters of the original silicon layer 13. The condensation of the germanium into the silicon layer 13 leads to the creation of a biaxial compressive strain in a plane parallel to the layer of insulator 12 in the element 34 formed. The limit between the element 34 and the regions 131 and 134 is positioned substantially plumb with the lateral faces of the strips 141 and 140, respectively. The superposition of the element 34 and of the layer 33 forms a stack.

As illustrated in FIG. 20, a layer 25 is then deposited on the wafer scale. The layer 25 is typically made of spin-on carbon (SoC) or an antireflective silicon-enriched hard mask.

The layer 25 formed precedingly then undergoes an etch or chemical-mechanical polish, which is stopped on the layers of hard mask 24 and 241, as illustrated in FIG. 21. The element 251, left over by the etch of the layer 25, is thus formed. The element 251 forms a protective layer and thus protects the $SiO_2$ layer 33 and the SiGe element 34 from the subsequent etching steps.

The layers of hard mask 24 and 241 are then removed by selective etching, thus unblocking access to the second deposit 32 formed beforehand. Thus, temporarily, access to the second deposit 32 is possible. This etch is then continued to form trenches 610 and 620, which separate the second deposit 32 from the strip 140 and from the strip 142, respectively. The layer 134 then forms the bottom of the trenches 610 and 620. The configuration illustrated in FIG. 22 is obtained.

A step of etching the layer 134 around the second deposit 32 advantageously anisotropically is then carried out, this etch is stopped on the layer 12, in order to obtain the configuration illustrated in FIG. 23. This etching allows trenches 61 and 62 to be formed in the extension of the trenches 610 and 620. The trenches 61 and 62 separate an element 137 and regions 132 and 130. In this example, a single trench encircles the element 137. The layer 12 then forms the bottom of the trenches 61 and 62. The superposition of the second deposit 32 and of the element 137 forms a stack called the second stack. The trenches 61 and 62 typically have a width comprised between 1 and 10 nm. In the present example, the trenches 61 and 62 are easily etched because of the trenches 610 and 620 produced beforehand. The trenches 610 and 620 form a good starting point allowing the layer 12 to easily be reached around the second deposit 32.

Next, an ion implantation is carried out that amorphizes the stack of the deposit 32 and of the element 137 depthwise. From the deposit 32, the amorphization forms a layer 322 made of amorphous SiGe. From the element 137, the amorphization forms an element 138 made of amorphous silicon. On the surface of the deposit 32, a layer 321 formed from a crystalline seed of non-amorphized SiGe is preserved. Thus, the configuration illustrated in FIG. 24 is obtained. The presence of the trenches 61 and 62 on either side of the layer 321 allows said layer 321 to not undergo lateral strain and to adopt a relaxed strain state in a plane parallel to the layer 12.

The protective layer 251 is then removed. Simultaneously, a recrystallisation anneal is also carried out in order to recrystallize the layer 322 and the layer 138. The anneal is for example carried out at a temperature of 600° C. to 700° C., advantageously maintained for 30 s to 5 min depending on the thickness of the SiGe/Si stack. The annealing operation allows the configuration illustrated in FIG. to be obtained, in which a layer 323 of relaxed SiGe has been formed above a crystalline Si element 139. The Si element 139 then takes the lattice parameter of the relaxed SiGe layer 323 and therefore becomes tensilely strained in a plane parallel to the layer 12.

Next, the relaxed SiGe layer 323 is removed by etching, this allowing the configuration illustrated in FIG. 26 to be obtained. The element 139 made of silicon preserves a tensile strain in a plane parallel to the layer 12.

As illustrated in FIG. 27, the $SiO_2$ layer 33 and the strips 140, 141 and 142 are then removed. Access on the one hand to the element 139 made of silicon and on the other hand to the element 34 made of SiGe is thus achieved.

Lastly, the elements 130, 131 and 132 are removed in order to form trenches by etching. The trenches are then filled with insulator in order to form the elements 1320, 1321 and 1322. This allows shallow trench isolations to be formed, as illustrated in FIG. 28. Thus, an isolation is formed between a first region for forming pMOS transistors and a second region for forming nMOS transistors.

Thus, at the end of the process involving the steps of the fabricating process according to this second embodiment, the following are obtained:
  an element 34 made of compressively strained SiGe for forming the channel of pMOS transistors in the first region;
  an element 139 made of tensilely strained silicon for forming the channel of nMOS transistors in the second region.

Furthermore this is done by epitaxy, with a low number of masking and photolithography steps.

Other regions of the structure may have an un-strained silicon layer for forming other transistors.

FIG. 29 is a view in cross section of an example of a structure 1 at a stage of a fabricating process according to a third embodiment. Initially, an FDSOI substrate configured to form nMOS and pMOS transistors in accordance with FIGS. 1 and 2 described above is provided.

A first deposit 41 of SiGe alloy is formed in the aperture 51 on the region 151 as illustrated in FIG. 29. A second deposit 42 of SiGe alloy is simultaneously formed in the aperture 52 on the region 152. The deposits 41 and 42 are typically formed by epitaxial growth. Processes for growing SiGe epitaxially are known per se to those skilled in the art. The deposits 41 and 42 typically have a thickness comprised between 5 nm and 30 nm. The deposits 41 and 42 for example have a germanium concentration (in number of atoms) comprised between 15 and 35%. The epitaxially grown deposit is for example SiGe containing 30% germanium, grown at a temperature of 630° C. for example using $H_2$ as vector gas and germane ($GeH_4$) and dichlorosilane (DCS, $SiH_2Cl_2$) as precursors (or silane $SiH_4$).

As illustrated in FIG. 30, the second deposit 42 is then covered with a layer 26 of hard mask, forming a protective layer. The second deposit 42 is then protected during the subsequent etching steps. Simultaneously, a layer of hard mask 261 is also deposited on the strip 141. The layers 26 and 261 are typically made of $SiO_2$. These layers 26 and 261 for example have a thickness comprised between 10 and 40 nm.

A thermally oxidizing anneal of the first SiGe deposit 41 is then carried out. This anneal causes germanium to diffuse from the first deposit 41 into the silicon layer 13, this leading to the formation, in said layer 13, of the following elements:
  an SiGe element 44 formed by enriching in Ge the layer 13;
  residual Si regions 131 and 134. The region 131 is placed plumb with the strip 141 of the layer of hard mask. The region 134 for its part lies plumb with the strip 140.

The upper surface of the element 44 is covered by a layer 43 of $SiO_2$ obtained via thermal oxidation of the first deposit 41. The obtained configuration is illustrated in FIG. 31. The SiGe element 44 preserves the lattice parameters of the original silicon layer 13 in its plane. The condensation of the germanium into the silicon layer 13 leads to the creation of a biaxial compressive strain in a plane parallel to the layer of insulator 12 in the element 44 formed. The limit between the element 44 and the regions 131 and 134 is positioned substantially plumb with the lateral faces of the strips 141 and 140, respectively. The superposition of the element 44 and of the layer 43 forms a stack.

As illustrated in FIG. 32, a layer 27 is then deposited on the wafer scale. The layer 27 is typically made of spin-on carbon (SoC) or an antireflective silicon-enriched hard mask.

The layer 27 formed precedingly then undergoes an etch or chemical-mechanical polish, which is stopped on the layers of hard mask 26 and 261, as illustrated in FIG. 33. The element 271 is thus formed from the layer 27. The element 271 thus forms a protective layer, which thus protects the first stack from the subsequent etching steps.

The layers of hard mask 26 and 261 are then removed by selective etching, thus unblocking access to the second deposit 42 formed beforehand, as illustrated in FIG. 34.

An inclined implantation process in which, for example, carbon (C) or oxygen (O) species are implanted in at least 2 different inclined directions, is then implemented. The implantation may advantageously be carried out in 4 inclined directions, included in two perpendicular planes. The inclination allows advantage to be taken of a shadow effect due to the larger height of the strips 140 and 142 with respect to the deposit 42. Following this operation, the configuration illustrated in FIG. 35 is obtained. A high concentration of implanted ions is thus present in a surface region 71 of the strip 142. A high concentration of implanted ions is also present in a surface region 72 of the second deposit 42 and in a surface region 73. A high concentration of implanted ions is lastly present in a surface region 74 of the strip 141 and on the surface and on the lateral faces of the element 271.

A step of etching the second deposit 42 and the layer 13 advantageously anisotropically is then carried out. The etch is stopped on the layer 12, in order to obtain the configuration illustrated in FIG. 36. This etching allows an element 421, remnant of the second deposit 42, to be formed. This etching also allows trenches 61 and 62, which divide the layer 13 into an element 137 and regions 130 and 132, to be formed. In this example, a single trench encircles the element 137. The layer 12 then forms the bottom of the trenches 61 and 62. The superposition of the elements 142 and 137 forms a stack. The trenches 61 and 62 typically have a width comprised between 1 and 10 nm. In the present example, the trenches 61 and 62 are easily etched because of the initial absence of implant at the surface of the second deposit 42 at the junction between said second deposit 42 and the strips 140 on one side and 142 on the other side.

An ion implantation is then carried out that amorphizes the element 421 depthwise, this resulting in the formation of a layer 4212 made of amorphous SiGe. The ionic implantation also amorphizes the element 137, this resulting in the formation of an element 138 made of amorphous silicon. On the surface of the element 421, a layer 4211 formed from a crystalline seed of non-amorphized SiGe is preserved. Thus, the configuration illustrated in FIG. 37 is obtained. The presence of the trenches 61 and 62 on either side of the layer 4211 allows said layer 4211 to not undergo lateral strain and to adopt a relaxed strain state in a plane parallel to the layer 12.

The first protective layer 271 is then removed. Simultaneously, an anneal is also carried out in order to recrystallize the layer 4212 and the element 138. The anneal is for example carried out at a temperature of 600° C. to 700° C., advantageously maintained for 30 s to 5 min depending on the thickness of the SiGe/Si stack. The annealing operation allows the configuration illustrated in FIG. 38 to be obtained, in which a layer 4213 of relaxed SiGe has been reformed above a crystalline Si element 139. The Si element 139 then takes the lattice parameter of the relaxed SiGe layer 4213 and therefore becomes tensilely strained in a plane parallel to the layer 12.

Next, the relaxed SiGe layer 4213 is removed by etching, this allowing the configuration illustrated in FIG. 39 to be obtained. The element 139 made of silicon preserves a tensile strain in a plane parallel to the layer 12.

As illustrated in FIG. 40, the $SiO_2$ layer 43 and the strips 140, 141 and 142 are then removed. Access on the one hand to the SiGe element 44 and on the other hand to the Si element 139 is thus achieved.

Lastly, the elements 130, 131 and 132 are removed in order to form trenches by etching. The trenches are then filled with insulator in order to form the elements 1320, 1321 and 1322. This allows shallow trench isolations to be formed, as illustrated in FIG. 41. Thus, an isolation is formed between a first region for forming pMOS transistors and a second region for forming nMOS transistors.

Thus, at the end of the process involving the steps of the fabricating process according to this third embodiment, the following are obtained:
an element 44 made of compressively strained SiGe for forming the channel of pMOS transistors in the first region;
an element 139 made of tensilely strained silicon for forming the channel of nMOS transistors in the second region.

Other regions of the structure may have an un-strained silicon layer for forming other transistors.

The elements 44 and 139 are obtained from the same initial deposit of SiGe by epitaxy, with a low number of masking and photolithography steps.

FIG. 42 is a view in cross section of an example of a structure 1 at a stage of a fabricating process according to a fourth embodiment. Initially, an FDSOI substrate 10 configured to form nMOS and pMOS transistors in accordance with FIGS. 1 and 2 described above is provided. In this embodiment, the order in which the regions of forming the nMOS and pMOS transistors are masked is inverted with respect to the first to third embodiments.

A first deposit 17 of SiGe alloy is formed in the aperture 51 on the region 151 as illustrated in FIG. 42. A second deposit 18 of SiGe alloy is simultaneously formed in the aperture 52 on the region 152. The deposits 17 and 18 are typically formed by epitaxial growth with lateral facets. The lateral faces of the deposits 17 and 18 are thus inclined. Processes for growing SiGe epitaxially with facets are known per se to those skilled in the art. The deposits 17 and 18 typically have a thickness comprised between 5 nm and 30 nm. The deposits 17 and 18 for example have a germanium concentration (in number of atoms) comprised between 15 and 35%. The epitaxially grown deposit is for example SiGe containing 30% germanium, grown at a temperature of 630° C. for example using $H_2$ as vector gas and germane ($GeH_4$) and dichlorosilane (DCS, $SiH_2Cl_2$) as precursors (or silane $SiH_4$).

As illustrated in FIG. 43, the second deposit 18 is then covered with a layer 26 of hard mask. The layer 26 forms a protective layer. The second deposit 18 is thus protected during the subsequent etching steps. Simultaneously, the strip 141 is also covered with a layer of hard mask 261. The layers 26 and 261 are typically made of $SiO_2$. These layers 26 and 261 for example have a thickness comprised between 10 and 40 nm.

Simultaneously, the first deposit 17 is partially etched in order to form an element 171, the thickness of which is advantageously comprised between 5 and 15 nm.

A thermally oxidizing anneal of the SiGe element 171 is then carried out. This anneal causes germanium to diffuse from the element 171 into the silicon layer 13, this leading to the formation, in said layer 13, of the following elements:
an SiGe element 172 formed by enriching in Ge the layer 13;
residual Si regions 131 and 134. The region 131 is placed plumb with the strip 141 of the layer of hard mask. The region 134 for its part extends from plumb with the strip 140.

The upper surface of the element 172 is covered by a layer 173 of $SiO_2$ obtained via thermal oxidation of the element 171. The obtained configuration is illustrated in FIG. 44. The superposition of the element 172 and of the layer 173 forms a stack. The SiGe element 172 preserves the lattice parameters of the original silicon layer 13. The condensation of the germanium into the silicon layer 13 leads to the creation of a biaxial compressive strain in a plane parallel to the layer of insulator 12 in the element 172 formed. The limit between the element 172 and the regions 131 and 134 is positioned substantially plumb with the lateral faces of the strips 141 and 140, respectively.

As illustrated in FIG. 45, a layer 27 is then deposited on the wafer scale. The layer 27 is typically made of spin-on carbon (SoC) or an antireflective silicon-enriched hard mask.

The layer 27 formed precedingly then undergoes an etch or chemical-mechanical polish, which is stopped on the layers of hard mask 26 and 261, as illustrated in FIG. 46. The element 271, remnant of the layer 27, is thus formed. The element 271 forms a protective layer, which thus protects the $SiO_2$ layer 173 and the SiGe element 172 from the subsequent etching steps.

The second protective layer 26 and the layer of hard mask 261 are then removed by etching, thus unblocking access to the second deposit 18 formed beforehand, as illustrated in FIG. 47.

A step of etching the second deposit 18 and the layer 13 advantageously anisotropically is then carried out. The etch is stopped on the layer 12, in order to obtain the configuration illustrated in FIG. 48. This etching allows trenches 61 and 62, which divide the layer 13 into an element 137 and regions 130 and 132, to be formed. In this example, a single trench encircles the element 137. The layer 12 then forms the bottom of the trenches 61 and 62. The superposition of the second deposit 18 and of the element 137 forms a stack. The trenches 61 and 62 typically have a width comprised between 1 and 10 nm. In the present example, the trenches 61 and 62 are easily etched because of the facets formed during the formation of the second deposit 18. The second deposit 18 thus has a very small thickness in proximity to the hard mask 14. Etching in proximity to the hard mask 14 thus allows the layer 12 to be easily reached around the second deposit 18.

An ion implantation is then carried out that amorphizes the second stack depthwise. The amorphization of the second deposit 18 results in the formation of a layer 181 made of amorphous SiGe. The amorphization of the element 137 results in the formation of an element 138 made of amorphous silicon. On the surface of the second deposit 18, a layer 182 formed from a crystalline seed of non-amorphized SiGe is preserved. Thus, the configuration illustrated in FIG. 49 is obtained. The presence of the trenches 61 and 62 on either side of the layer 182 allows said layer 182 to not undergo lateral strain and to adopt a relaxed strain state in a plane parallel to the layer 12.

An anneal is then carried out in order to recrystallize the layer 181 and the element 138. The anneal is for example carried out at a temperature of 600° C. to 700° C., advantageously maintained for 30 s to 5 min depending on the thickness of the SiGe/Si stack. The annealing operation allows the configuration illustrated in FIG. 50 to be obtained, in which a layer 183 of relaxed SiGe has been reformed above a crystalline Si element 139. The Si element 139 then takes the lattice parameter of the relaxed SiGe layer 183 and therefore becomes tensilely strained in a plane parallel to the layer 12.

Next, the relaxed SiGe layer 183 is removed by etching stopped on the element 139, this allowing the configuration illustrated in FIG. 51 to be obtained. The element 139 made of silicon preserves a tensile strain in a plane parallel to the layer 12.

As illustrated in FIG. 52, the $SiO_2$ layer 173 and the strips 140, 141 and 142 are then removed. Access on the one hand to the SiGe element 172 and on the other hand to the Si element 139 is thus achieved.

Lastly, the elements 130, 131 and 132 are removed in order to form trenches by etching. The trenches are then filled with insulator in order to form the elements 1320, 1321 and 1322. This allows shallow trench isolations to be formed, as illustrated in FIG. 53. Thus, an isolation is formed between a first region for forming pMOS transistors and a second region for forming nMOS transistors.

Thus, at the end of the process involving the steps of the fabricating process according to this fourth embodiment, the following are obtained:

an element 172 made of compressively strained SiGe for forming the channel of pMOS transistors in the first region;

an element 139 made of tensilely strained silicon for forming the channel of nMOS transistors in the second region.

Other regions of the structure may have an un-strained silicon layer for forming other transistors.

The elements 139 and 172 are obtained from the same initial deposit of SiGe by epitaxy, with a low number of masking and photolithography steps.

The invention claimed is:

1. A process for fabricating an integrated circuit comprising an nMOS transistor and a pMOS transistor, the process comprising the steps of:

providing a substrate comprising a silicon layer disposed on a layer of insulator, a layer of hard mask disposed on the silicon layer, and first and second apertures surrounded by the hard mask and giving access to first and second regions of the silicon layer, respectively;

simultaneously forming first and second deposits of SiGe alloy by epitaxy on the first and the second regions of the silicon layer in order to form a first stack of the silicon layer and of the first deposit, and a second stack of the silicon layer and of the second deposit, respectively; then covering the first deposit with a first protective layer and maintaining access to the second deposit; then performing an etch of the silicon layer up to the layer of insulator, in order to form trenches in the silicon layer between the hard mask and two opposite edges of the second stack; then forming a tensilely strained silicon layer in the second region via an amorphization of the second region and of a bottom portion of the second deposit and preservation of a crystallized top portion in the second deposit; then crystallizing the second deposit and the second region in order to tensilely strain the second region; and enriching the first region in germanium by diffusion from the first deposit.

2. The process according to claim 1, wherein the enriching comprises a step of condensing germanium into the first region.

3. The process according to claim 2, wherein the enriching further comprises a step of thermally oxidizing and annealing the second deposit.

4. The process according to claim 2, wherein the condensing step is performed after the step of crystallizing the second deposit and the second region.

5. The process according to claim 1, further comprising a step of covering the second deposit with a second protective layer and of maintaining an access to the first deposit, the second protective layer being made of a material different from that of the first protective layer.

6. The process according to claim 1, wherein the crystallizing of the second deposit and of the second region in order to tensilely strain the second region is followed by a step of removing the second deposit.

7. The process according to claim 1, wherein performing the etch step forms a trench between a portion of the hard mask separating the first and the second apertures and an edge of the second stack.

8. The process according to claim 1, wherein the second deposit of SiGe alloy is performed so as to form lateral facets, and the etch is an anisotropic etch so as to remove a periphery of the second deposit and of the second region.

9. The process according to claim 1, wherein the step of simultaneously forming the first and the second deposits of SiGe alloy is preceded by a step of conformal deposition of insulator on the first and the second regions and on the hard mask, and preceded by a step of anisotropically etching the conformal deposit of insulator so as to uncover one portion of the first and the second regions and so as to preserve a spacer against sidewalls of the hard mask encircling the first and the second apertures, and wherein the step of performing the etch up to the layer of insulator comprises an etch of the spacer and an etch of a periphery of the second deposit.

10. The process according to claim 1, wherein the first and the second deposits are formed so as to have a height smaller than that of the hard mask, the process further comprising steps of inclined implantation of carbon or of oxygen into the second deposit in at least two different implantation directions, so as to form a median region of the second deposit, in which region a concentration of implanted ions is higher than a concentration of implanted ions on a periphery of the second deposit, and wherein the step of performing the etch up to the layer of insulator comprises an etch of a periphery of the stack of the second region and of the second deposit.

11. The process according to claim 1, further comprising a step of forming a shallow trench isolation between the first and the second apertures subsequently to the steps of forming the tensilely strained silicon layer and of enriching the first region in germanium.

12. The process according to claim 1, further comprising a step of forming an nMOS transistor, a channel of which includes the tensilely strained second region; and a step of forming a pMOS transistor, a channel of which includes the first region enriched in germanium.

13. The process according to claim 1, wherein the first and the second deposits have a germanium concentration comprised between 15% and 35%.

14. The process according to claim 1, comprising simultaneously forming the first and second deposits of SiGe alloy in the first and second apertures, respectively.

15. The process according to claim 1, comprising performing the etch of the silicon layer using the hard mask as a mask.

16. A process for fabricating an integrated circuit comprising an nMOS transistor and a pMOS transistor, the process comprising the steps of providing a substrate comprising a silicon layer disposed on a layer of insulator, a layer of hard mask disposed directly on the silicon layer, and first and second apertures defined in the hard mask and exposing first and second regions of the silicon layer, respectively;

simultaneously forming first and second deposits of SiGe alloy by epitaxy on the first and the second regions of the silicon layer in the first and second apertures, respectively, in order to form a first stack of the silicon layer and of the first deposit, and a second stack of the silicon layer and of the second deposit, respectively;

covering the first deposit with a first protective layer;

after the covering, etching the silicon layer to form a trench in the silicon layer between the hard mask and edges of the second stack;

amorphizing a portion of the second deposit and a portion of the silicon layer of the second stack;

crystallizing the portion of the silicon layer of the second stack to produce a tensilely strained region; and diffusing germanium from the first deposit into the silicon layer of the first stack.

* * * * *